(12) United States Patent
Ikeuchi

(10) Patent No.: US 9,870,148 B2
(45) Date of Patent: Jan. 16, 2018

(54) CONFIGURATION CONTROL SYSTEM AND CONFIGURATION CONTROL METHOD

(71) Applicant: NEC Corporation, Minato-ku, Tokyo (JP)

(72) Inventor: Katsuhisa Ikeuchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 97 days.

(21) Appl. No.: 14/896,705

(22) PCT Filed: Mar. 4, 2014

(86) PCT No.: PCT/JP2014/055394
§ 371 (c)(1),
(2) Date: Dec. 8, 2015

(87) PCT Pub. No.: WO2014/199678
PCT Pub. Date: Dec. 18, 2014

(65) Prior Publication Data
US 2016/0139811 A1    May 19, 2016

(30) Foreign Application Priority Data

Jun. 12, 2013  (JP) ................................. 2013-123473

(51) Int. Cl.
*H03K 19/173*  (2006.01)
*G06F 3/06*  (2006.01)
(Continued)

(52) U.S. Cl.
CPC .......... *G06F 3/0604* (2013.01); *G06F 3/0629* (2013.01); *G06F 3/0679* (2013.01); *G06F 11/142* (2013.01); *H03K 19/17752* (2013.01)

(58) Field of Classification Search
CPC .... G06F 3/0604; G06F 3/0629; G06F 3/0679; G06F 11/142; H03K 19/17752
(Continued)

(56) References Cited

U.S. PATENT DOCUMENTS

| 6,874,108 | B1 * | 3/2005 | Abramovici | ....... | G01R 31/3016 |
|   |   |   |   |   | 713/401 |
| 7,047,352 | B1 * | 5/2006 | Khu | ................. | H03K 19/17772 |
|   |   |   |   |   | 711/103 |
| 7,973,556 | B1 * | 7/2011 | Noguera Serra | .. | H03K 19/0016 |
|   |   |   |   |   | 326/38 |

FOREIGN PATENT DOCUMENTS

JP    04-023134 A    1/1992
JP    07-106425 A    4/1995
(Continued)

OTHER PUBLICATIONS

International Search Report for PCT Application No. PCT/JP2014/055394, dated Jun. 3, 2014.

*Primary Examiner* — Daniel D Chang

(57) ABSTRACT

An FPGA can be started up without system failure when a soft error occurs. A configuration control system includes: a first semiconductor chip which is capable of programming a logic circuit inside an LSI; a semiconductor memory which stores a plurality of pieces of circuit information of the first semiconductor chip; and a second semiconductor chip which, when controlling a configuration of the semiconductor chip using the circuit information stored in the semiconductor memory, if the configuration using any one of the plurality of pieces of circuit information fails, performs a re-configuration using another piece of circuit information among the plurality of pieces of circuit information.

4 Claims, 18 Drawing Sheets

(51) Int. Cl.
*G06F 11/14* (2006.01)
*H03K 19/177* (2006.01)

(58) Field of Classification Search
USPC .............................................. 326/38, 40, 46
See application file for complete search history.

(56) References Cited

FOREIGN PATENT DOCUMENTS

| | | |
|---|---|---|
| JP | 2004-021867 A | 1/2004 |
| JP | 2008-165627 A | 7/2008 |
| JP | 2010-066961 A | 3/2010 |
| JP | 2012-190368 A | 10/2012 |

\* cited by examiner

CONFIGURATION CONTROL SYSTEM AND CONFIGURATION CONTROL METHOD

This application is a National Stage Entry of PCT/JP2014/055394 filed on Mar. 4, 2014, which claims priority from Japanese Patent Application 2013-123473 filed on Jun. 12, 2013, the contents of all of which are incorporated herein by reference, in their entirety.

TECHNICAL FIELD

The present invention relates to a configuration control system and a configuration control method.

BACKGROUND ART

A field programmable gate array (FPGA) is a large scale integration (LSI) constituting a digital circuit that supports the advance of a digital device and a network device. LSIs are generally divided into logical LSIs that execute signal processing, control, and the like in a device, and memories that accumulate data and programs. An FPGA is classified as a logical LSI thereamong.

In daily life, consumers rarely have the opportunity to see an FPGA. However, in a process in which a developer of an electronic device creates a prototype and increases the degree of completeness, an FPGA is almost always used. Recently, FPGAs have also been mounted in products to be purchased by consumers.

An FPGA has unique characteristics not found in other logical LSIs, such as an application specific integrated circuit (ASIC) that is a custom LSI, an application specific standard product (ASSP) that is a standard LSI, and a microprocessor. The unique characteristics are characteristics that an electronic circuit can be freely programmed. These characteristics keep up with development trends of electronic devices progressing in complication, scale, costs, and short product lifetime.

With the advent of microprocessors, a function of a device can be freely changed by rewriting software. However, even when a microprocessor is used, hardware cannot be changed in terms of, for example, a type of an arithmetic logic unit to be used and a structure of a memory. When an FPGA is used, a circuit structure that is hardware can be freely changed for the purpose of improved performance, low power consumption, or the like. Due to these characteristics, FPGAs are widely applied to devices including state-of-the-art industrial devices, such as base stations for mobile phones and semiconductor manufacturing apparatuses, to household devices, such as digital home appliances and mobile devices.

A variety of technologies related to such circumstances are known (for example, see Patent Documents 1 to 3).

For example, Patent Document 1 discloses an information processing system which includes a central processing unit (CPU), a memory, a bus under control of the CPU and the memory, and a configuration control means arranged on the bus and performing configuration control of an FPGA. More specifically, this information processing system includes a bus switch for disconnecting the FPGA from the bus from start to end of the configuration control. Thus, the information processing system provides an advantageous effect that, when the FPGA subjected to configuration control accommodates a system bus and the like, the FPGA is disconnected from the bus using a reset signal as an enable signal for the bus switch, thereby realizing continuous availability of the system.

Further, for example, Patent Document 2 discloses a method for guaranteeing startup of a programmable logic circuit in which one of logic circuit data stored in a first memory and logic circuit data stored in a second memory is read and the configuration is performed to determine the structure of the logic circuit at the time of startup after power-on. More specifically, in the method for guaranteeing startup of a programmable logic circuit, at the time of startup of the programmable logic circuit, after the programmable logic circuit performs initialization, logic circuit data stored in the first memory is read, the configuration is performed, an elapsed time of the configuration in the programmable logic circuit until the configuration is completed is monitored, it is determined that the first memory is abnormal if the elapsed time exceeds a set time, and an abnormality notification signal is generated. Then, in the method for guaranteeing startup of a programmable logic circuit, when the abnormality notification signal is received, the memory is switched from the first memory to the second memory, and the configuration is performed on the programmable logic circuit again using logic circuit data stored in the second memory. In this way, with this method for guaranteeing startup of a programmable logic circuit is used, the memory is automatically switched to the second memory and the configuration of the programmable logic circuit can be executed even if the first memory for configuration fails.

Further, for example, Patent Document 3 discloses a configuration technique in which after power-on, an FPGA reads circuit information stored in a first configuration read only memory (ROM) and a second configuration ROM and the FPGA is subjected to configuration. More specifically, in this configuration technique, first, the FPGA starts the configuration from the first configuration ROM. Then, in this configuration technique, when the configuration is being performed from the first configuration ROM, if a configuration error detection signal is output from the FPGA, a configuration path is switched to the second configuration ROM, and the configuration starts from the second configuration ROM. Thus, using this configuration technique, it is possible to guarantee the startup of the FPGA while shortening time from power-on to startup of the FPGA.

PRIOR ART DOCUMENTS

Patent Documents

Patent Document 1: Japanese Unexamined Patent Application, First Publication No. 2004-021867
Patent Document 2: Japanese Unexamined Patent Application, First Publication No. 2010-066961
Patent Document 3: Japanese Unexamined Patent Application, First Publication No. 2012-190368

SUMMARY OF INVENTION

Problems to be Solved by the Invention

A programmable device has advantages in terms of power consumption, performance, costs, or the like with the miniaturization of a device process, but is susceptible to a soft error due to cosmic rays.

Therefore, a phenomenon occurs in which the programmable device does not start up normally despite there being no hardware failure, hardware repair should be performed each time the phenomenon occurs, and extra effort and costs are generated. Further, when the FPGA gets stuck and the system fails, it is troublesome for a customer who operates the system, and thus there is a problem in terms of fail-safeness. The soft error is a phenomenon caused by cosmic rays such as a rays and/or neutron rays reaching the earth's surface, and data in a storage unit of a semiconductor chip is temporarily rewritten or the logic value of a flip-flop is inverted.

Since the soft error is not hardware failure but transient failure, there is no repeatability and analysis is difficult. However, the soft error can be generally prevented by mounting an error detection and correction circuit to detect and correct the soft error. Similarly, in the FPGA, a certain bit of a bit stream that is circuit information may be inverted at the time of the configuration due to the soft error. The FPGA has a mechanism in which hardware intellectual property (IP) of a cyclic redundancy check (CRC) circuit is mounted in the inside and abnormality in input circuit information is detected. However, in a system with the FPGA, the abnormality in the circuit information causes the following problems.

A first problem is that the FPGA can detect the abnormality in the circuit information using the CRC circuit on but cannot correct an abnormal bit.

A second problem is that the FPGA cannot be started up due to the first problem despite there being no failure of hardware, and the system gets stuck.

A third problem is that, since a CPU or the like cannot access the FPGA in a state of the second problem, software installed in the system can recognize only failure of the hardware of the FPGA.

A fourth problem is that power on/off, system reset, or the like may be manually performed to perform the configuration again in a stage of a development phase, but it is not easy to manually perform recovery in an in-service system.

For these, the system with the FPGA is categorized as hardware failure, and thus the consent of the customer cannot be obtained.

On the other hand, when the technology disclosed in Patent Document 1 is used, the FPGA is disconnected in response to a reset signal while the configuration of the FPGA is being performed. Accordingly, when a soft error occurs, the FPGA cannot be started up without failure of the system.

Further, when the technology disclosed in Patent Document 2 is used, it is necessary to include an abnormality monitoring circuit for configuration that measures a configuration time and determines whether the time exceeds a certain threshold value. Typically, because the configuration time changes depending on the type of an FPGA device, the abnormality monitoring circuit for configuration should be redesigned for each FPGA to be used, and thus a circuit structure is complicated. Moreover, when the technology described in Patent Document 2 is used, an infinite loop starts if both of a main memory for configuration (first memory) and a sub-memory for configuration (second memory) are abnormal.

Further, when the technology disclosed in Patent Document 3 is used, circuit information to be first read after power-on is limited to data stored in the first configuration ROM. Therefore, when the technology disclosed in Patent Document 3 is used, if the configuration fails using the data stored in the first configuration ROM but the configuration succeeds using data stored in the second configuration ROM, it is necessary to subsequently repair the data stored in the first configuration ROM. Further, when the technology disclosed in Patent Document 3 is used, in order to update the data in the configuration ROM, updated data should first be written to the second configuration ROM and then written to the first configuration ROM again.

In this way, when the technologies disclosed in Patent Documents 1 to 3 are used, various problems occur, for example, the FPGA cannot be started up without the system failure when the soft error occurs.

An exemplary object of the present invention is to provide a configuration control system and a configuration control method that solve the above-described problems.

Means for Solving the Problems

In order to solve the above problems, a first exemplary aspect of the present invention is a configuration control system, including: a first semiconductor chip which is capable of programming a logic circuit inside an LSI; a semiconductor memory which stores a plurality of pieces of circuit information of the first semiconductor chip; and a second semiconductor chip which, when controlling a configuration of the first semiconductor chip using the circuit information stored in the semiconductor memory, if the configuration using any one of the plurality of pieces of circuit information fails, performs a re-configuration using another piece of circuit information among the plurality of pieces of circuit information.

A second exemplary aspect of the present invention is a configuration control method, including a step of: when controlling a configuration of a first semiconductor chip which is capable of programming a logic circuit inside an LSI using a plurality of pieces of circuit information of the first semiconductor chip stored in a semiconductor memory, if the configuration using any one of the plurality of pieces of circuit information fails, performing a re-configuration using another piece of circuit information among the plurality of pieces of circuit information.

Also, all necessary characteristics of the present invention are not listed in the above summary of the invention. Further, sub-combinations of the characteristics can also be the present invention.

Advantageous Effects of Invention

As apparent from the above description, with the present invention, it is possible to start up the FPGA without the system failure when the soft error occurs.

MODES FOR CARRYING OUT THE INVENTION

Hereinafter, the present invention will be described through exemplary embodiments of the invention, but the following exemplary embodiments do not limit the invention in accordance with the claims, and not all combinations of features described in the exemplary embodiments are necessarily essential to the solution of the invention.

Figure 1:
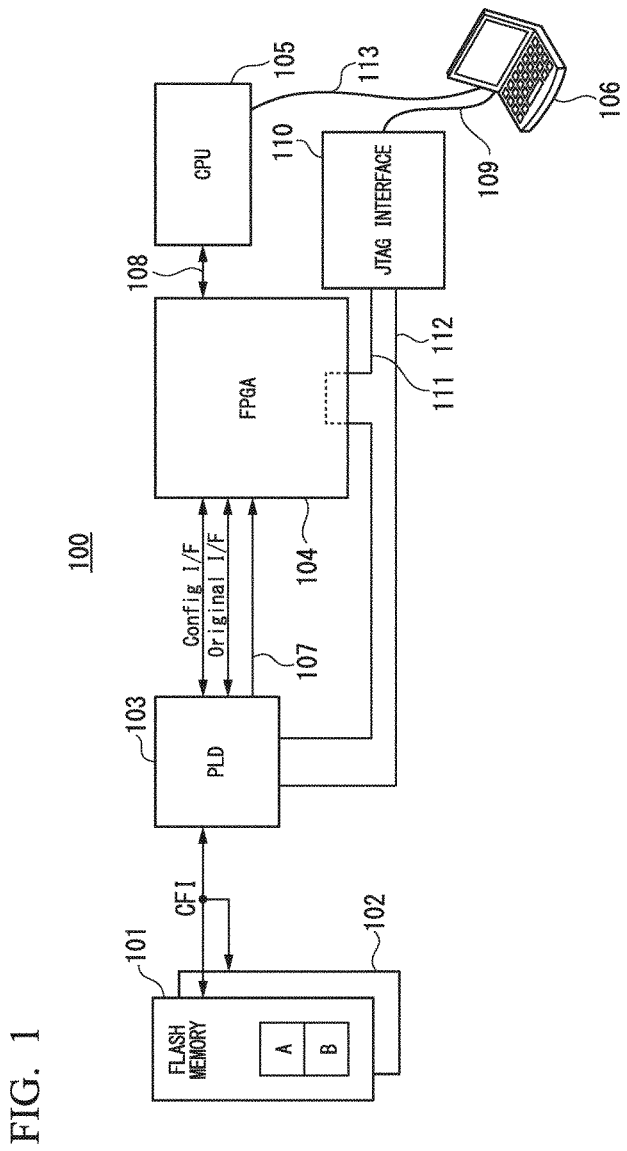
FIG. 1 is a diagram illustrating an example of a block structure of a configuration control system 100 in accordance with an exemplary embodiment.

FIG. 1 illustrates an example of a block configuration of a configuration control system 100 in accordance with an exemplary embodiment. The configuration control system 100 is a system that writes circuit information to an FPGA and a programmable logic device (PLD).

The configuration control system 100 includes a flash memory 101, a flash memory 102, a PLD 103, an FPGA 104, a CPU 105, a personal computer 106, and a joint test action group (JTAG) interface 110.

The flash memory 101 and the flash memory 102 are semiconductor memories on which erasure and writing of data can be freely performed, and content thereof is not erased even when power supply is off. For example, the flash memory 101 and the flash memory 102 are connected to the PLD 103 via a common flash interface (CFI). Further, two pieces of information including first circuit information A and second circuit information B having design-specific programming data are stored in the flash memory 101 and the flash memory 102. Further, each of the flash memory 101 and the flash memory 102 includes a first storage area C (see FIGS. 3 and 5) for storing the first circuit information A and a second storage area D (see FIGS. 3 and 5) for storing the second circuit information B. The flash memory 101 and the flash memory 102 include a startup side information area E (see FIGS. 3 and 5) for storing startup side information indicating which circuit information A (B) is used to perform the configuration. The flash memory 101 and the flash memory 102 include start/end address information areas F (see FIGS. 3 and 5) for storing start address values indicating start positions of the circuit information A and the circuit information B and end address values indicating end positions of the circuit information A and the circuit information B. It is to be noted that here, the circuit information A and the circuit information B are treated as startup sides. The flash memory 101 and the flash memory 102 are examples of the "semiconductor memory" in the present invention.

The PLD 103 is a volatile programmable device, and has a function of reading the circuit information A and the circuit information B stored in the flash memory 101 and the flash memory 102 and controlling a configuration sequence of the FPGA 104. The PLD 103 is connected to the FPGA 104 via an interface Config I/F. The PLD 103 reads the circuit information A and the circuit information B stored in the flash memory 101 and the flash memory 102 and performs a configuration implemented by the circuit information A and the circuit information B on the FPGA 104. Also, the PLD 103 includes a signal line 107 for notifying the FPGA 104 about which circuit information A (B) among the circuit information A and the circuit information B stored in the flash memory 101 and the flash memory 102 is used to perform the configuration. The signal line 107 is a signal line for transferring a 1-bit signal, and provides a level signal from the PLD 103 to the FPGA 104 while the FPGA 104 is performing the configuration. The PLD 103 is an example of the "second semiconductor chip" in the present invention. The PLD 103 includes a retry sequencer for performing a re-configuration using the other circuit information, i.e., the second circuit information B, when the configuration using the first circuit information A fails.

The FPGA 104 monitors the circuit information A and the circuit information B received from the PLD 103 and check integrity indicating whether data garbling does not occur in the circuit information A and the circuit information B due to a soft error or the like. The FPGA 104 is an example of the "first semiconductor chip" in the present invention. The FPGA 104 is connected to the CPU 105 via a cable 108.

When the CPU 105 updates a circuit of the FPGA 104 in accordance with the upgrade or the like, the circuit information A and the circuit information B are written from the CPU 105 to the flash memory 101 and the flash memory 102 via the FPGA 104 and an interface Original I/F.

The personal computer 106 is connected to the PLD 103 and the FPGA 104 via the JTAG interface 110 connected to a cable 109, and via cables 111 and 112. Further, the personal computer 106 is connected to the CPU 105 via a cable 113.

Figure 2:
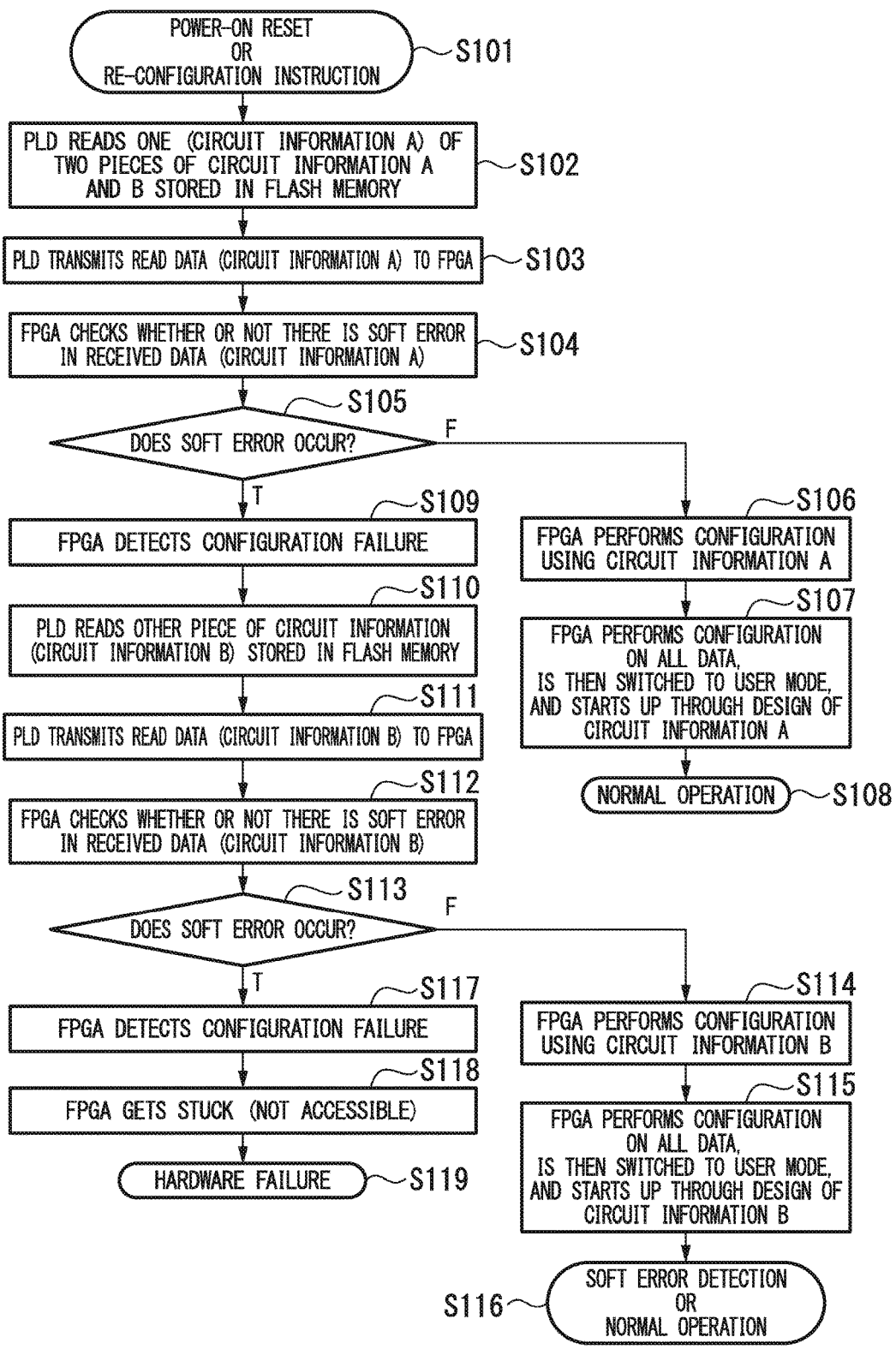
FIG. 2 is a flowchart describing a basic configuration sequence of the configuration control system 100.

FIG. 2 is a flowchart describing a basic control operation of the configuration control system 100. In this case, the configuration control system 100 includes a single flash memory 101, and the flash memory 101 can store first circuit information A in a first storage area C and store second circuit information B in a second storage area D. It is to be noted that when the configuration control system 100 includes the flash memory 101 and the flash memory 102, the flash memory 101 can store the first circuit information A in the first storage area C, and the flash memory 102 can store the second circuit information B in the second storage area D. When the CPU 105 starts control, the CPU 105 executes power-on reset or a re-configuration instruction (step S101). Then, the PLD 103 reads the first circuit information A among the two pieces of circuit information A and B stored in the flash memory 101 (step S102). Subsequently, the PLD 103 transmits the read data of the first circuit information A to the FPGA 104 (step S103). Then, the FPGA 104 checks whether or not there is a soft error in the received data of the first circuit information A (step S104). Then, the CPU 105 determines whether the soft error occurs (step S105). If a determination result in step S105 is "F (False)," the FPGA 104 performs the configuration using the data of the first circuit information A (step S106). Then, after performing the configuration on all data, the FPGA 104 is switched to a user mode and starts up through a design of the data of the first circuit information A (step S107). Then, the CPU 105 performs a normal operation (step S108).

If a determination result of step S105 is "T (True)," the FPGA 104 detects failure of the configuration of the data using the first circuit data A (step S109). Then, the PLD 103 reads the other circuit information, i.e., the second circuit information B, among the two pieces of circuit information A and B stored in the flash memory 101 (step S110). Subsequently, the PLD 103 transmits the read data of the second circuit information B to the FPGA 104 (step S111). Then, the FPGA 104 checks whether or not there is a soft error in the received data of the second circuit information B (step S112). The CPU 105 then determines whether the soft error occurs (step S113). If a determination result in step S113 is "F (False)," the FPGA 104 performs the configuration using the data of the second circuit information B (step S114). After performing the configuration on all data, the FPGA 104 is then switched to the user mode and starts up through a design of the data of the second circuit information B (step S115). Then, the CPU 105 detects the soft error or performs a normal operation (step S116).

If a determination result of step S113 is "T (True)," the FPGA 104 detects failure of the configuration using the data of the second circuit information B (step S117). As a result, the FPGA 104 gets stuck and is not accessible (step S118). Then, the CPU 105 detects hardware failure (step S119). It is to be noted that the configuration control system 100 including the flash memory 101 and the flash memory 102 can perform a routine similar to that described above.

Figure 3:
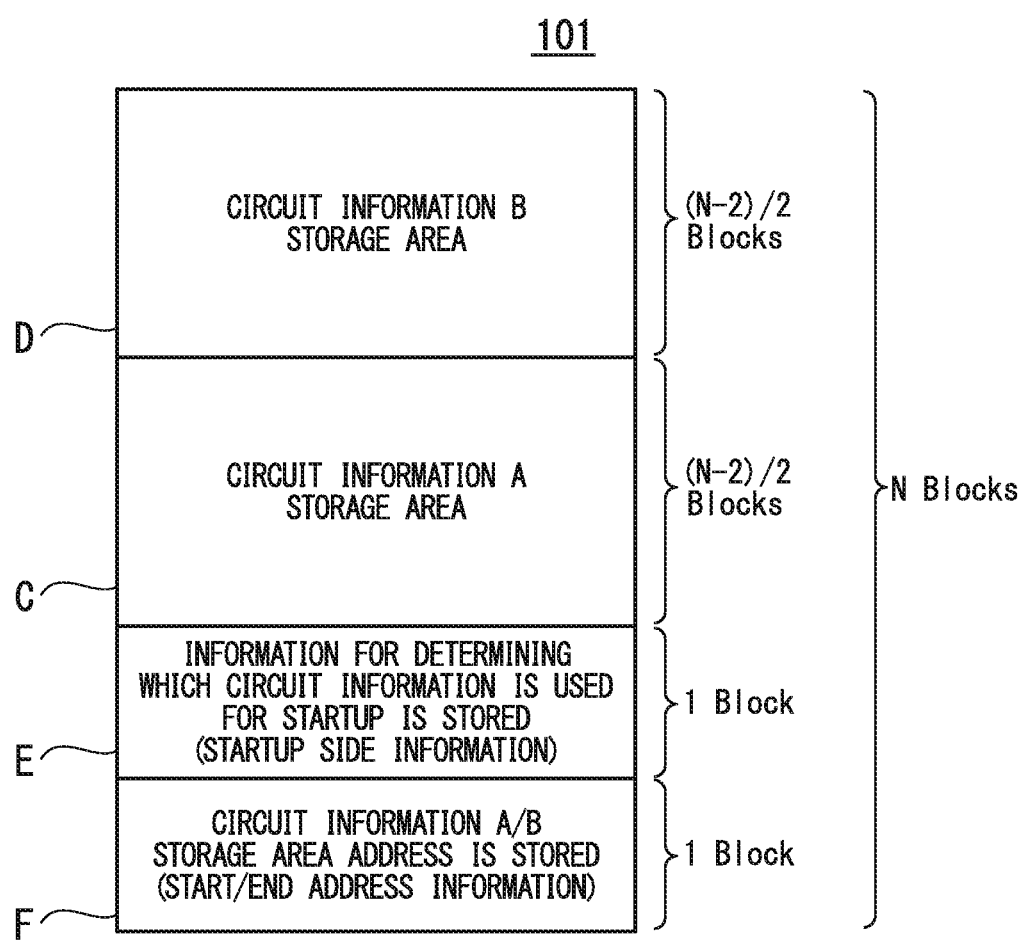
FIG. 3 is a diagram illustrating an example of an address map of a flash memory 101.

FIG. 3 is a diagram illustrating an example of an address map of the flash memory 101. The flash memory 101 stores the first circuit information A in the first storage area C and stores the second circuit information B in the second storage area D. The flash memory 101 includes the second storage area D for storing the second circuit information B corresponding to an (N−2)/2 blocks among N blocks. The flash memory 101 includes the first storage area C for storing the first circuit information A corresponding to (N−2)/2 blocks among the N blocks. The flash memory 101 includes a startup side information area E corresponding to one block among the N blocks. The flash memory 101 includes a start/end address information area F corresponding to one block among the N blocks. It is to be noted that in FIG. 3 as well as FIGS. 4, 5, and 6, the first storage area C is referred to as circuit information A storage area C, and the second storage area D is referred to as circuit information B storage area D.

Figure 4:
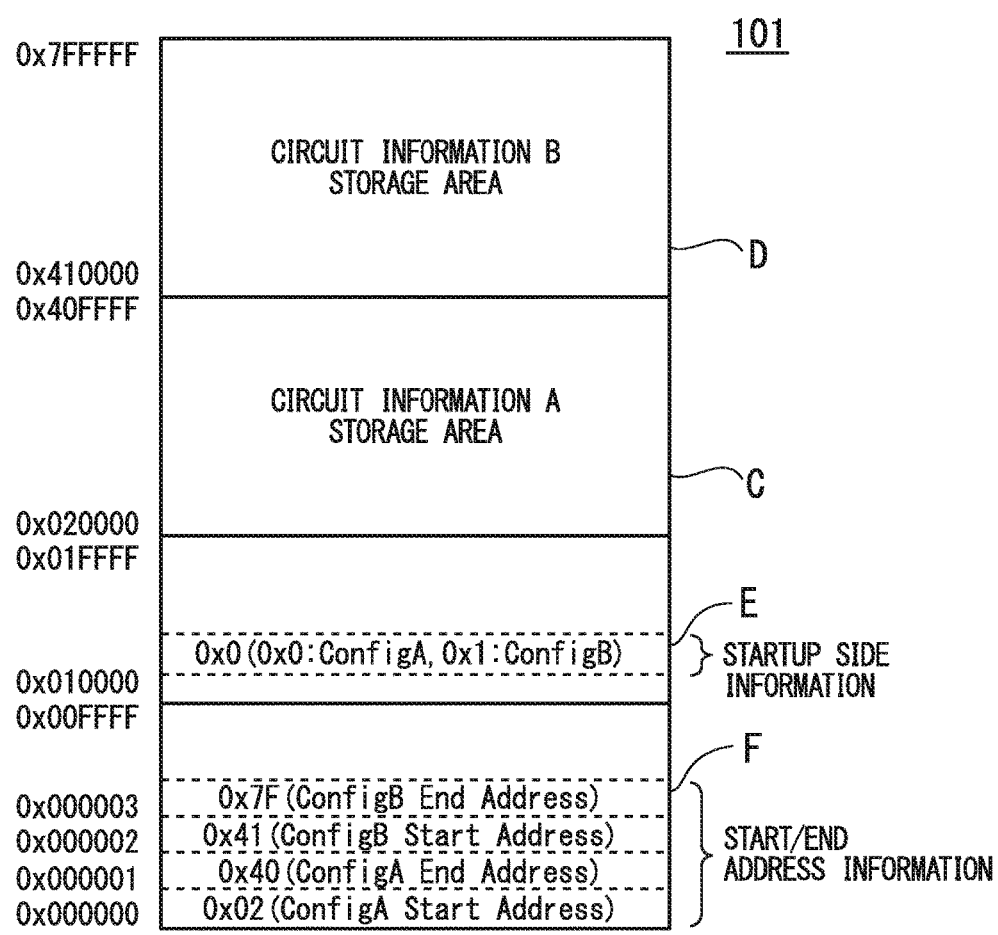
FIG. 4 is a diagram illustrating that address values are inserted into the address map of the flash memory 101 of FIG. 3.

FIG. 4 is a diagram illustrating that address values are inserted into the address map of the flash memory 101 illustrated in FIG. 3. A storage capacity of the flash memory 101 is 128 Mbits. Address values of the second storage area D are 0x7FFFFF to 0x410000. Address values of the first storage area C are 0x40FFFF to 0x020000. An address value of the startup side information area E is 0x010000, and in the example of FIG. 4, 0x0 (0x0: ConfigA, 0x1: ConfigB) indicating that the FPGA 104 starts up using the circuit information A is stored. Address values of the start/end address information area F are 0x000003 to 0x000000. 0x7F is stored as an end address (ConfigB End Address) of the circuit information B storage area D in 0x000003. 0x41 is stored as a start address (ConfigB Start Address) of the circuit information B storage area D in 0x000002. 0x40 is stored as an end address (ConfigA End Address) of the circuit information A storage area C in 0x000001. 0x02 is stored as a start address (ConfigA Start Address) of the circuit information A storage area C in 0x000000. It is to be noted that the address values stored in the start/end address information area F are not real address values, and values of which 16 lower bits are omitted are stored. This is because a minimum unit of a bit width of data in the flash memory 101 is 8 bits, and thus the flash memory 101 stores only values indicating an address area of 8 upper bits that identifies an area of one block (0x010000), and the PLD 103 performing reading from the flash memory 101 supplements the 16 lower bits (that is, supplements "0x0000" in the case of the start address, and supplements "0xFFFF" in the case of the end address).

Figure 5:
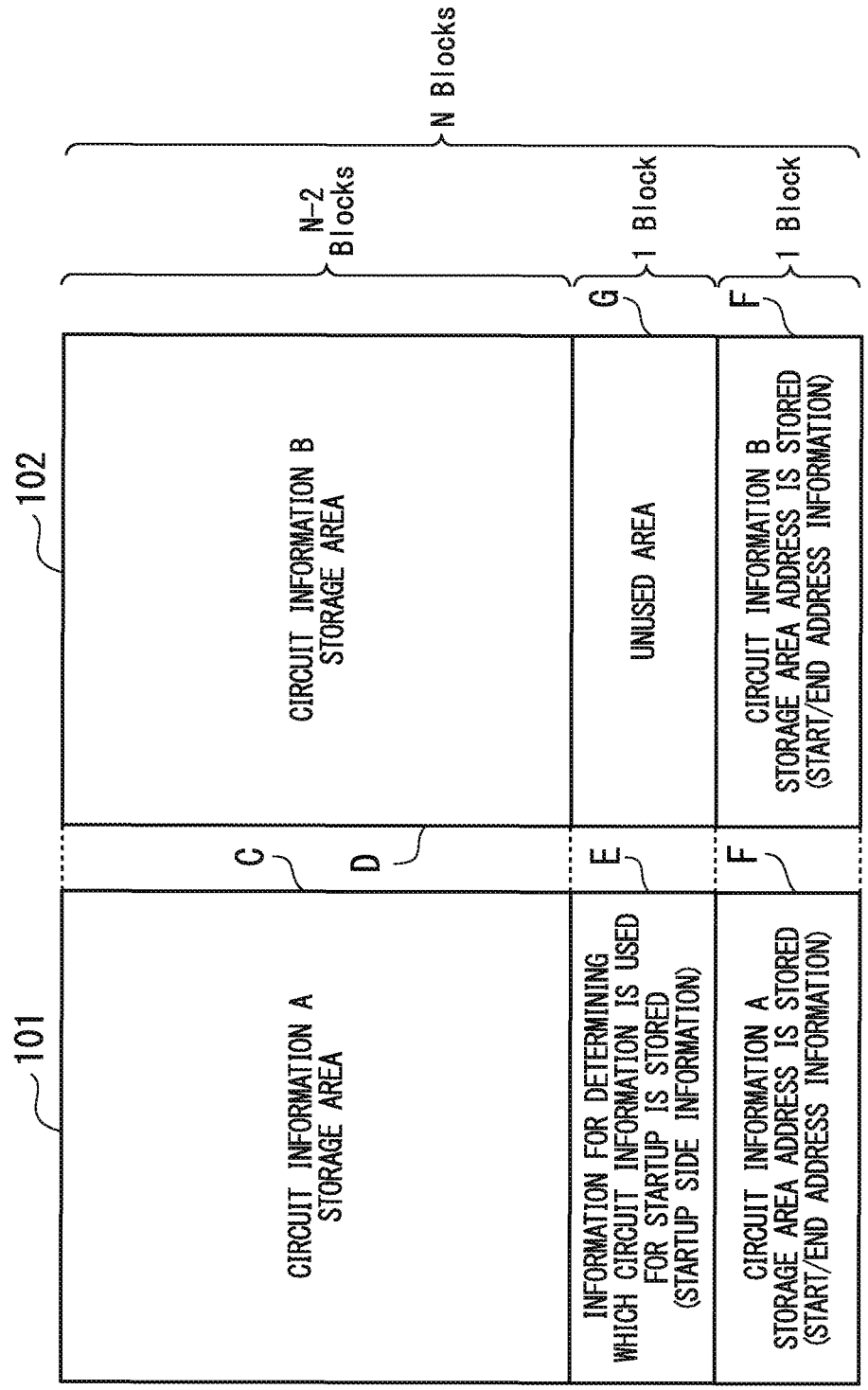
FIG. 5 is a diagram illustrating an example of address maps of flash memories 101 and 102.

FIG. 5 is a diagram illustrating an example of address maps when the configuration control system 100 includes the flash memory 101 and the flash memory 102. The flash memory 101 stores the first circuit information A in the first storage area C, and the flash memory 102 stores the second circuit information B in the second storage area D. The flash memory 101 includes the first storage area C for storing the first circuit information A corresponding to (N−2) blocks among N blocks. The flash memory 101 includes the startup side information area E corresponding to one block among the N blocks. The flash memory 101 includes the start/end address information area F for first the circuit information A corresponding to one block among the N blocks. The second circuit information B having design-specific programming data is stored in the flash memory 102, similar to the flash memory 101. The flash memory 102 includes the second storage area D for storing the second circuit information B corresponding to (N−2) blocks among the N blocks. The flash memory 102 has an unused area G corresponding to one block among the N blocks. The flash memory 102 includes the start/end address information area F for the second circuit information B corresponding to one block among the N blocks. The flash memory 102 does not include a startup side information area E.

Figure 6:
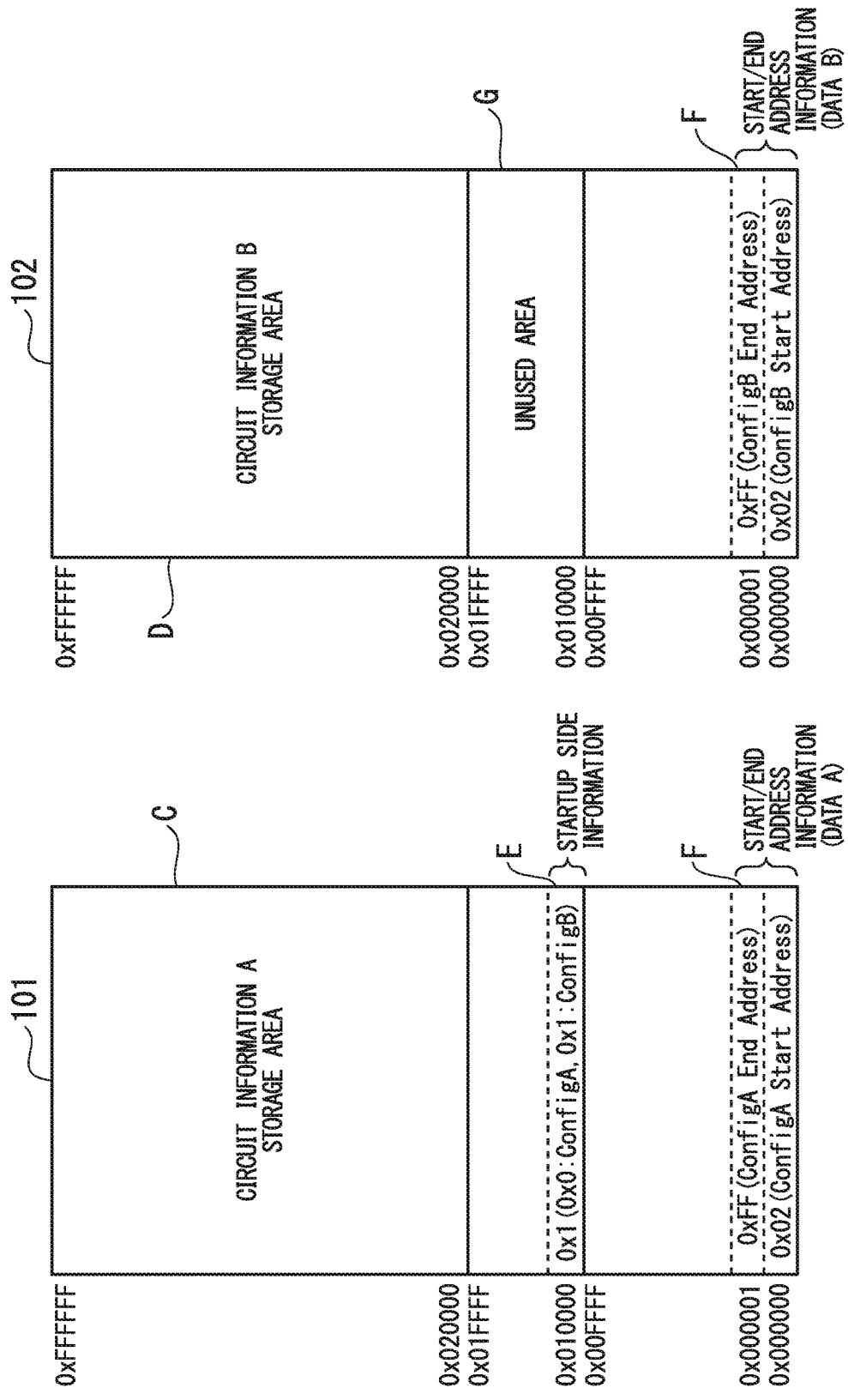
FIG. 6 is a diagram illustrating that address values are inserted into the address maps of the flash memories 101 and 102 in FIG. 5.

FIG. 6 is a diagram illustrating that address values are inserted into the address maps of the flash memory 101 and the flash memory 102 illustrated in FIG. 5. A storage capacity of the flash memory 101 and the flash memory 102 is 256 Mbits. In the flash memory 101, the address values of the first storage area C are 0xFFFFFF to 0x020000. The address value of the startup side information area E is 0x010000, and in the example of FIG. 6, 0x1 (0x0: ConfigA, 0x1: ConfigB) indicating that the FPGA 104 starts up using the circuit information B is stored. The address values of the start/end address information area F are 0x000001 to 0x000000. 0xFF is stored in 0x000001 as an end address (ConfigA End Address) of the circuit information A storage area C. 0x02 is stored in 0x000000 as a start address (ConfigA Start Address) of the circuit information A storage area C. In the flash memory 102, the address values of the second storage area D are 0xFFFFFF to 0x020000. The address values of the unused area G are 0x01FFFF to 0x010000. The address values of the start/end address information area F are 0x000001 to 0x000000. 0xFF is stored in 0x000001 as an end address (ConfigB End Address) of the circuit information B storage area D. 0x02 is stored in 0x000000 as a start address (ConfigB Start Address) of the circuit information B storage area D. It is to be noted that in this case, the address values stored in the start/end address information are not real address values, but are values in which 16 lower bits are omitted.

Figure 7:
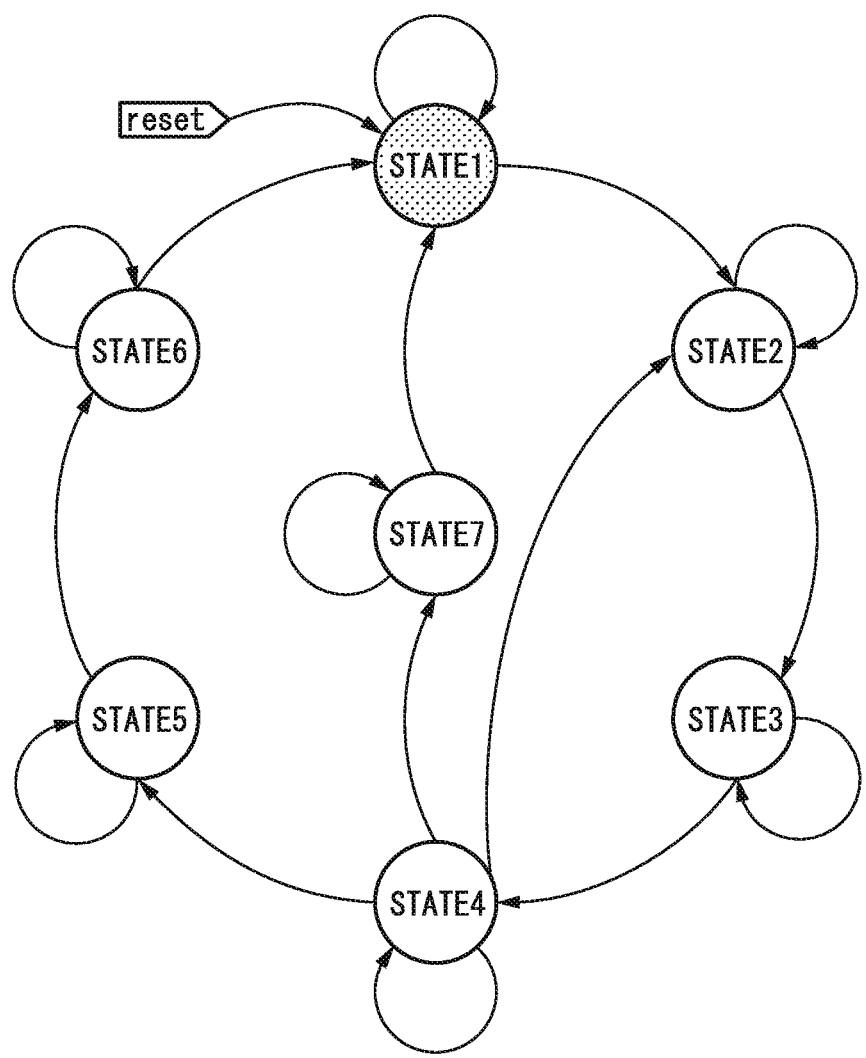
FIG. 7 is a state transition diagram of a PLD 103.

FIG. 7 is a state transition diagram of the PLD 103. STATE1 is an initial state after the PLD 103 is reset, and the PLD 103 returns all registers in the PLD 103 to the initial state, disables a configuration start signal to be output to the FPGA 104, and unconditionally transitions to STATE2.

In STATE2, when the transition is from STATE1, the PLD 103 reads the startup side information of the flash memory 101 and the flash memory 102. In STATE2, when the transition is from STATE4, the PLD 103 inverts the startup side information held within the PLD 103 to perform a second configuration. It is to be noted that in this case, in STATE2, the PLD 103 enables the configuration start signal to be output to the FPGA 104, and transitions to STATE3 after a specific cycle.

In STATE3, the FPGA 104 can be subjected to the configuration. That is, STATE3 is a state in which the PLD 103 waits to receive a configuration instruction signal from the FPGA 104. It is to be noted that in this case, in STATE3, the PLD 103 disables the configuration start signal to be output to the FPGA 104, and transitions to STATE4 when the configuration instruction signal is asserted by the FPGA 104.

In STATE4, the PLD 103 waits for completion of the configuration of the FPGA 104. In STATE4, the PLD 103 transitions to STATE5 when a configuration completion signal is asserted by the FPGA 104. In STATE4, when the configuration instruction signal is deasserted by the FPGA 104 during the configuration, that is, when a state in which the configuration fails, the PLD 103 counts up a configuration failure counter included in the PLD 103. If a counter value=1 (first configuration failure), the PLD 103 transitions to STATE2. In STATE4, if the counter value=2 (second configuration failure), the PLD 103 transitions to STATE7.

STATE5 is a state in which the configuration of the FPGA 104 has been completed. In STATE5, if there is a user mode switching signal from the FPGA 104, the PLD 103 transitions to STATE6 when the signal is asserted or after a specific cycle.

STATE6 is a state in which the configuration of the FPGA 104 is completed and the PLD 103 transitions to the user mode. In STATE6, when the PLD 103 receives a re-configuration instruction signal from the CPU 105 via the FPGA 104, the PLD 103 transitions to STATE1. Further, in STATE6, when the configuration instruction signal is deasserted by the FPGA 104 (the FPGA 104 is in an abnormal state), the PLD 103 transitions to STATE1.

STATE7 is a state in which the configuration of the FPGA 104 has been abnormally ended. In STATE7, when a re-configuration instruction signal is received from the CPU 105 via the FPGA 104, the PLD 103 transitions to STATE1. Further, in STATE7, when the configuration instruction signal is deasserted by the FPGA 104 (FPGA 104 is in an abnormal state), the PLD 103 transitions to STATE1.

Figure 8:
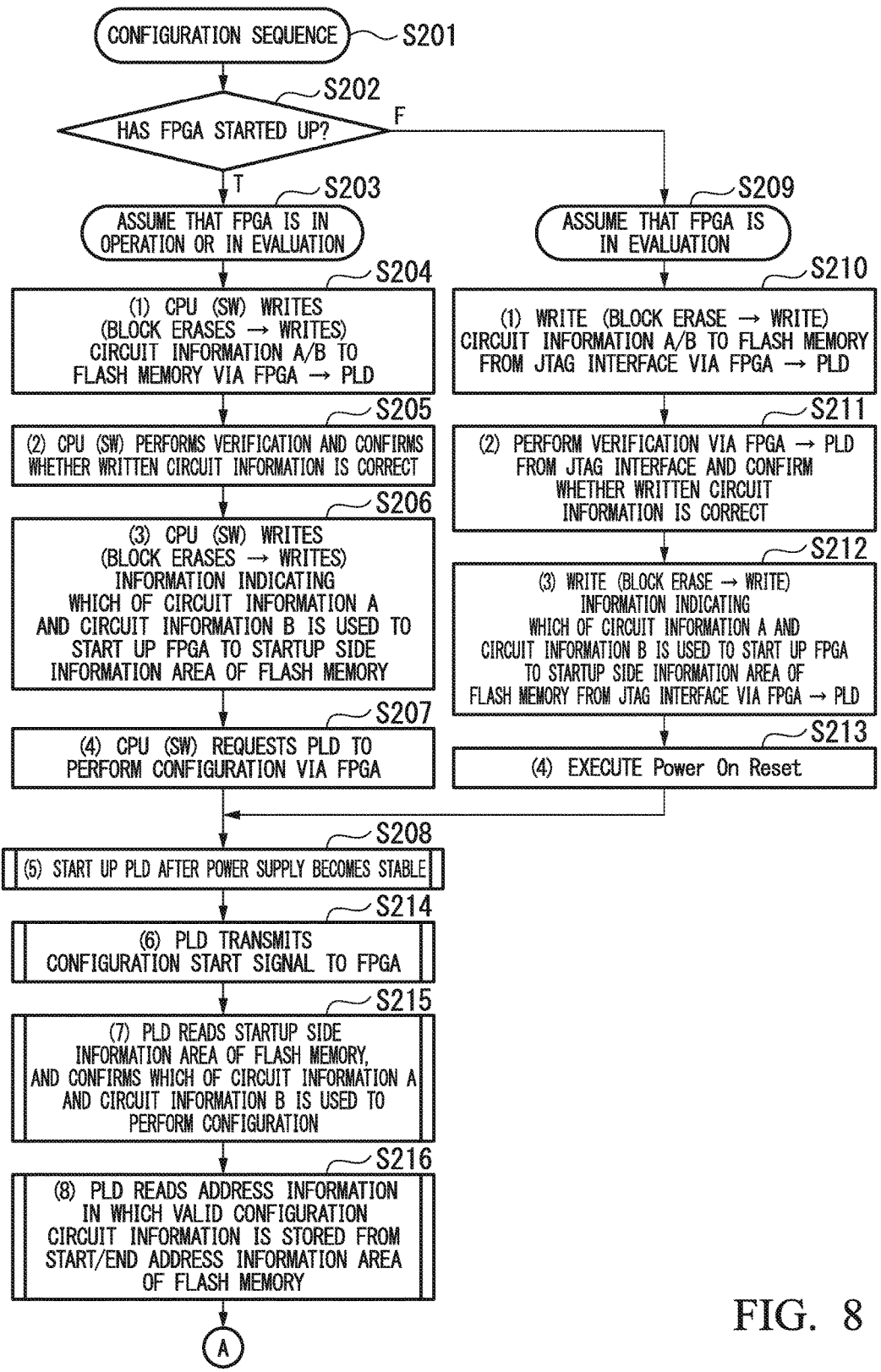
FIG. 8 is a flowchart describing a specific configuration sequence of the configuration control system 100.
Figure 9:
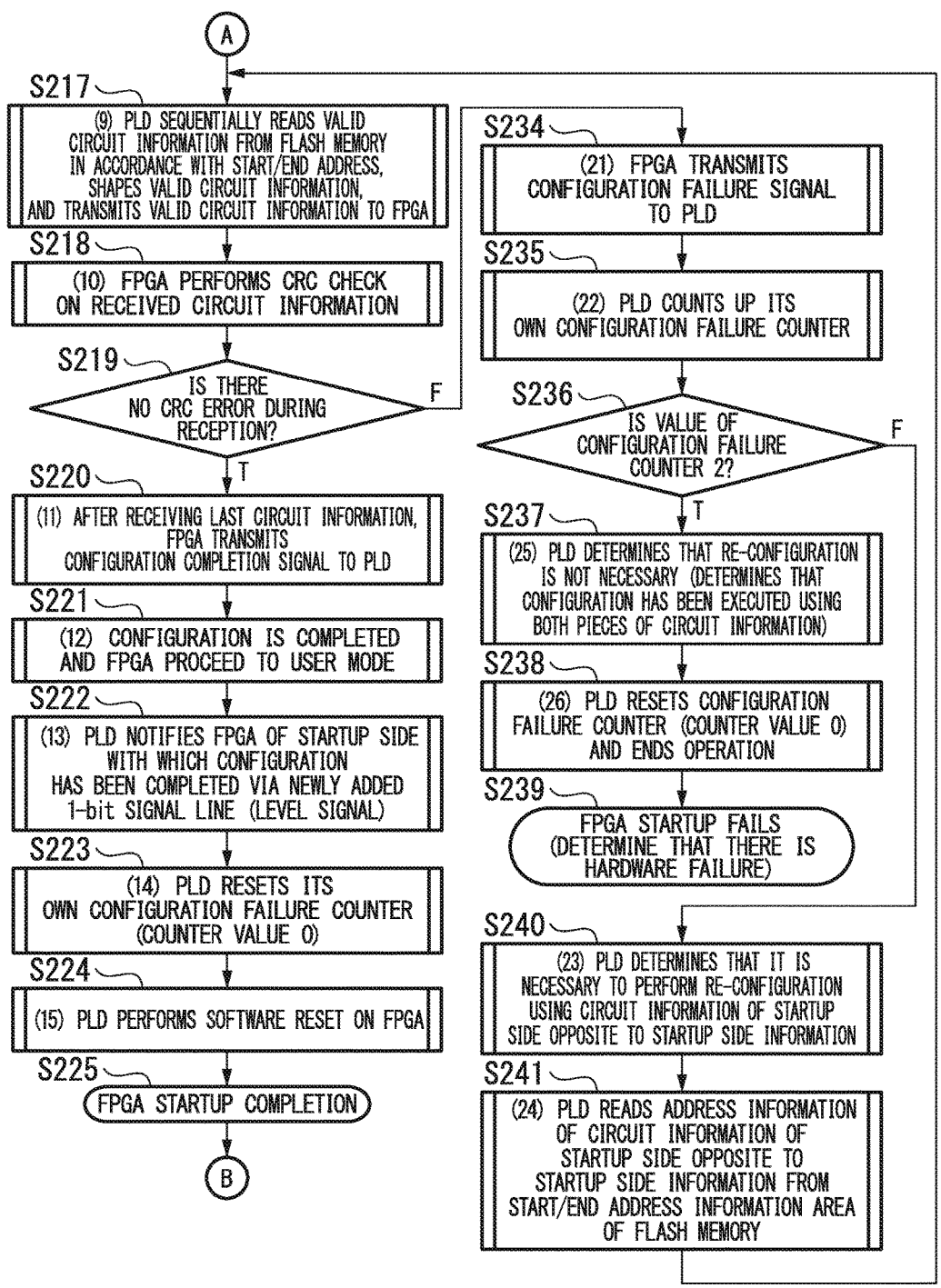
FIG. 9 is a flowchart illustrating a specific configuration sequence of the configuration control system 100.
Figure 10:
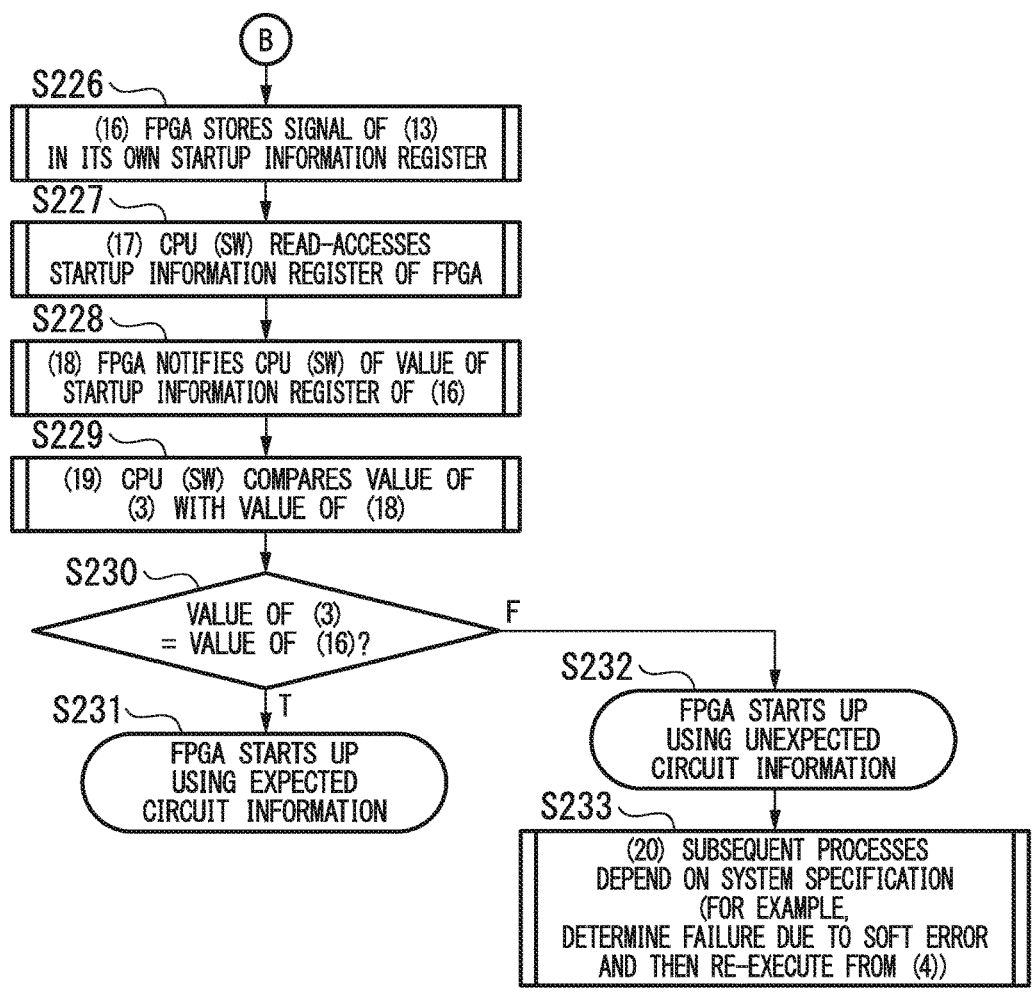
FIG. 10 is a flowchart illustrating a specific configuration sequence of the configuration control system 100.

FIGS. 8 to 10 are flowcharts describing specific configuration sequences of the configuration control system 100. It is to be noted that here, while a case in which the configuration control system 100 includes the single flash memory 101 will be described, a similar routine can be executed even when the configuration control system 100 includes the flash memory 101 and the flash memory 102. First, the CPU 105 starts execution of the configuration sequence (step S201). Then, the CPU 105 determines whether the FPGA 104 has started up (step S202). If a determination result in step S202 is "T (True)," the CPU 105 assumes that the FPGA 104 is in operation or in evaluation (step S203). Then, the CPU 105 writes the circuit information A and the circuit information B to the flash memory 101 (specifically, block erase→write, that is, block-erase and then write) (step S204) via the FPGA 104 and the PLD 103 sequentially (described as FPGA 104→PLD 103 in FIG. 8). Then, the CPU 105 performs verification and confirms whether the written data is correct (step S205). Then, the CPU 105 writes information indicating which of the circuit information A and the circuit information B is used to start up the FPGA 104, to the startup side information area E of the flash memory 101 (block erase→write) (step S206). Subsequently, the CPU 105 requests the PLD 103 to perform the configuration via the FPGA 104 (step S207). Then, the CPU 105 starts up the PLD 103 after power supply becomes stable (step S208).

In contrast, if the determination result in step S202 is "F (False)," the CPU 105 assumes that the FPGA is in the evaluation (step S209). Then, the CPU 105 writes the circuit information A and the circuit information B from the JTAG interface 110 to the flash memory 101 via the FPGA 104 and the PLD 103 sequentially (block erase→write) (step S210). Then, the CPU 105 performs verification from the JTAG interface 110 via the FPGA 104 and the PLD 103 sequentially, and confirms whether the written data is correct (step S211). Also, the CPU 105 writes information indicating which of the circuit information A and the circuit information B is used to start up the FPGA 104 from the JTAG interface 110 to the startup side information area E of the flash memory 101 via the FPGA 104 and the PLD 103 sequentially (block erase→write) (step S212). Then, the CPU 105 executes power-on reset (step S213). Then, the CPU 105 starts up the PLD 103 after power supply becomes stable (step S208).

After step S208, the PLD 103 transmits a configuration start signal to the FPGA 104 (step S214). Then, the PLD 103 reads the startup side information area E of the flash memory 101, and confirms which of the circuit information A and the circuit information B is used to perform the configuration (step S215). Subsequently, the PLD 103 reads address information in which valid configuration data is stored, from the start/end address information area F of the flash memory 101 (step S216). Then, the PLD 103 sequentially reads the valid circuit information from the flash memory 101 in accordance with the start/end address, shapes the valid circuit information, and transmits the valid circuit information to the FPGA 104 (step S217). Then, the FPGA 104 performs CRC check on the received data (step S218). Then, the CPU 105 determines whether a CRC error occurs during the reception (step S219).

Then, if a determination result in step S219 is "T (True)," the FPGA 104 receives last data and then transmits the configuration completion signal to the PLD 103 (step S220). Then, the FPGA 104 proceeds to the user mode with the completion of the configuration. Subsequently, the PLD 103 notifies the FPGA 104 of a startup side with which the configuration has been completed via the newly added signal line 107 (step S222). Then, the PLD 103 resets its own configuration failure counter (counter value 0) (step S223). Subsequently, the PLD 103 performs software reset on the FPGA 104 (step S224).

As a result, the startup of the FPGA 104 is completed (step S225). Then, the FPGA 104 stores the signal obtained in step S222 in its own startup information register (step S226). Subsequently, the CPU 105 read-accesses the startup information register of the FPGA 104 (step S227). Then, the FPGA 104 notifies the CPU 105 of the value of the startup information register in step S226 (step S228). Then, the CPU 105 compares the value obtained in step S206 with the value obtained in step S228 (step S229). Then, the CPU 105 determines whether the value obtained in step S206 is equal to the value obtained in step S228 (step S230).

If a result of the determination in step S230 is "T (True)," the FPGA 104 performs startup using the expected circuit information (step S231). In contrast, if the determination result of step S230 is "F (False)," the FPGA 104 performs startup using unexpected circuit information (step S232).

Therefore, the CPU 105 performs a subsequent process that depends on a system specification; for example, performs a process of determining failure due to a soft error and then re-executing a routine from step S207 (step S233).

In contrast, if the determination result in step S219 is "F (False)," the FPGA 104 transmits the configuration failure signal to the PLD 103 (step S234). Then, the PLD 103 counts up the configuration failure counter (step S235). Then, the PLD 103 determines whether or not a value of the configuration failure counter is "2" (step S236).

If the determination result in step S236 is "T (True)," the PLD 103 determines that the configuration is not necessary. That is, the PLD 103 determines that the configuration has been executed using the circuit information A and the circuit information B (step S237). Then, the PLD 103 resets the configuration failure counter (counter value 0) and ends the operation (step S238). Thus, the CPU 105 determines that the startup of the FPGA 104 fails and thus there is hardware failure (step S239).

If the determination result of step S236 is "F (False)," the PLD 103 determines that it is necessary to perform re-configuration using the circuit information of a startup side opposite to a startup side indicated by the startup side information (step S240). Then, the PLD 103 reads address information of the circuit information of the startup side opposite to the startup side indicated by the startup side information from the start/end address information area F of the flash memory 101 (step S241). Then, the routine from step S217 is executed again.

Figure 11:
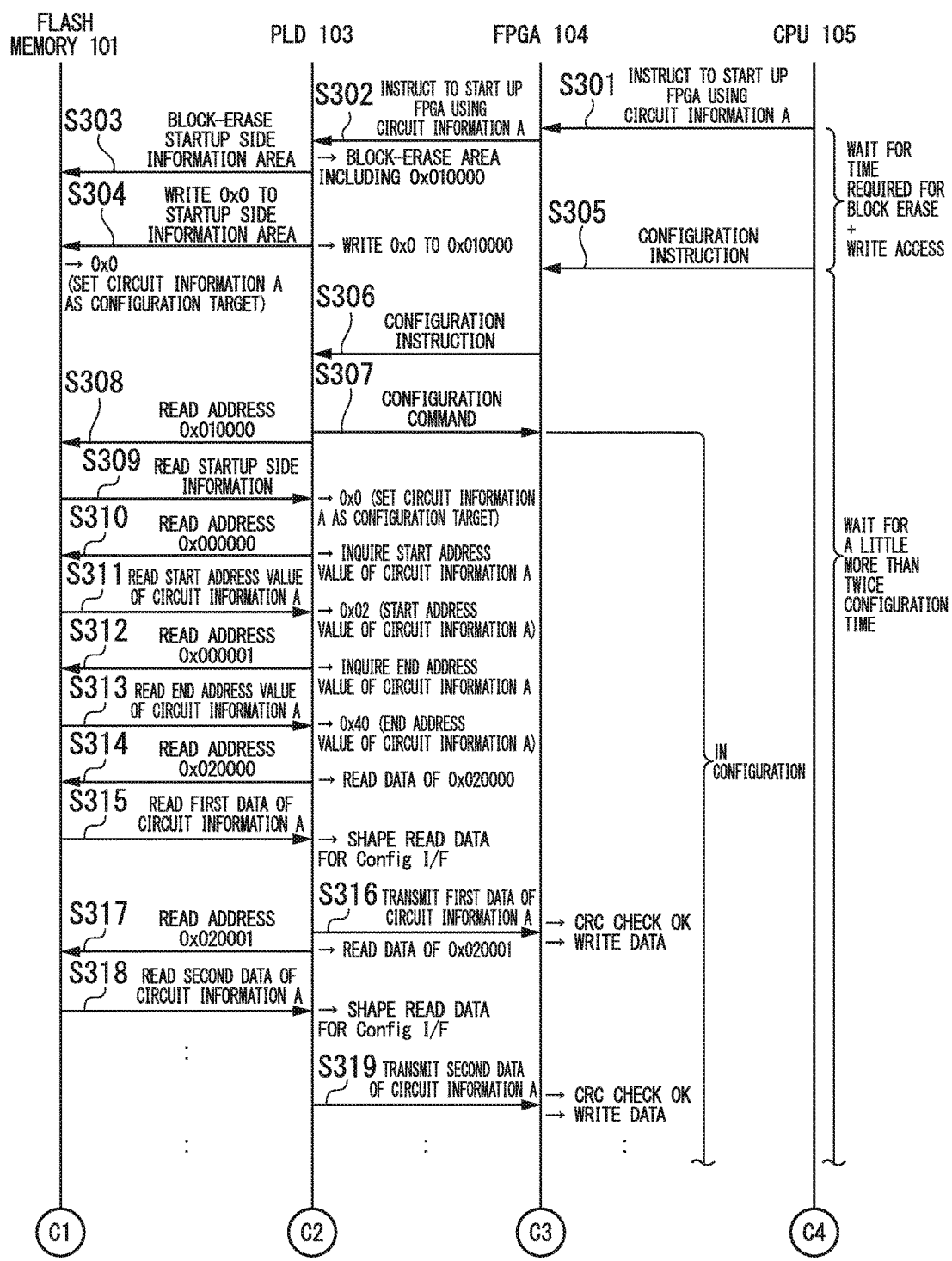
FIG. 11 is a diagram illustrating an example of a specific behavior of the configuration control system 100.
Figure 12:
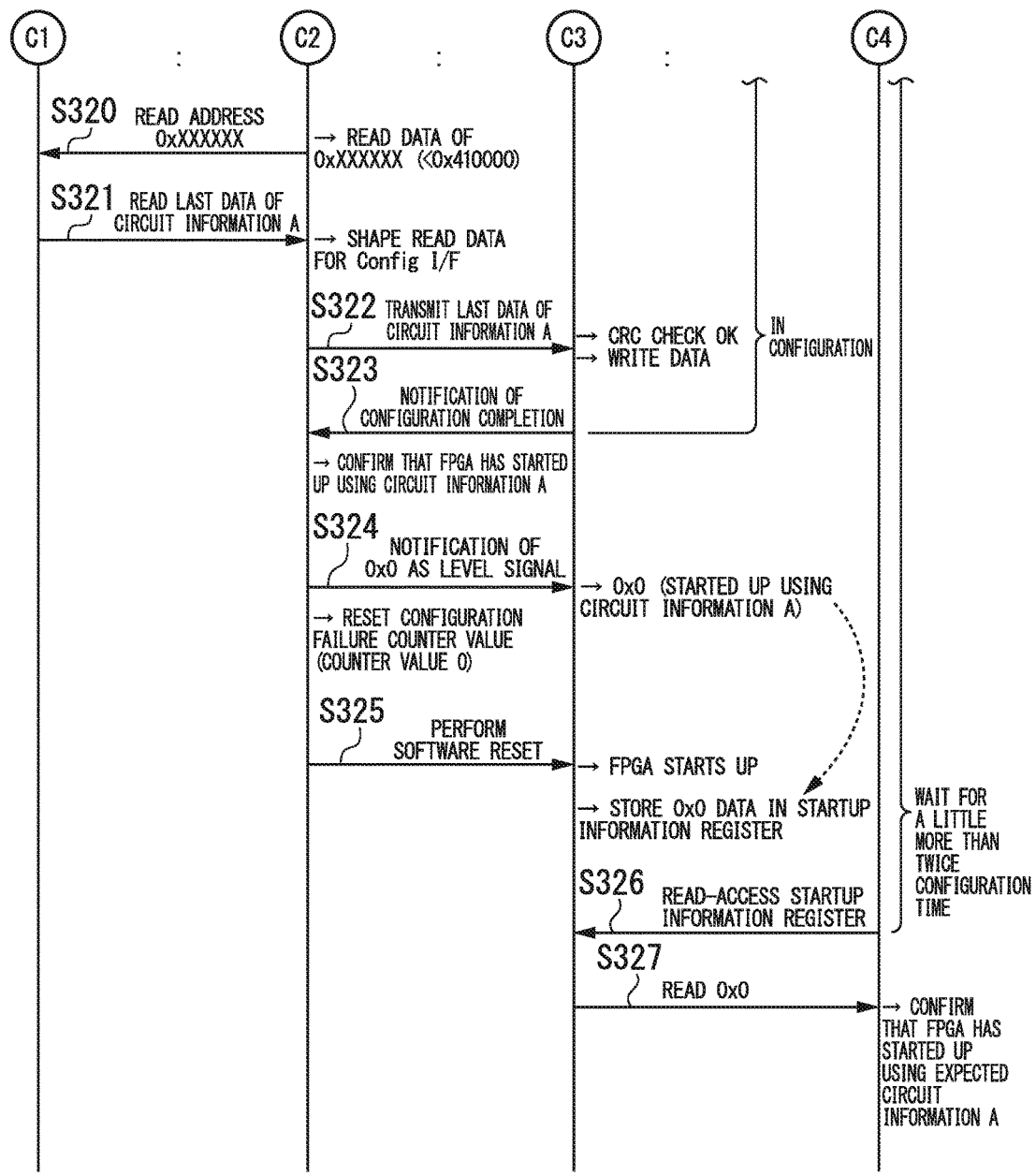
FIG. 12 is a diagram illustrating an example of a specific behavior of the configuration control system 100.

FIGS. 11 and 12 are diagrams illustrating an example of specific behavior of the configuration control system 100 when a soft error does not occur. It is to be noted that here, while a case in which the configuration control system 100 includes the single flash memory 101 will be described, a similar routine can be executed even when the configuration control system 100 includes the flash memory 101 and the flash memory 102. First, the CPU 105 provides a startup instruction using the first circuit information A to the FPGA 104 (step S301). Then, the FPGA 104 provides a startup instruction using the first circuit information A to the PLD 103 (step S302). Then, the PLD 103 block-erases the startup side information area E (step S303). In this case, the PLD 103 block-erases an area including the address value 0x010000. Further, the PLD 103 writes 0x0 to the startup side information area E (step S304). That is, the PLD 103 writes 0x0 to the address value 0x010000 to set the first circuit information A as a configuration target.

Then, the CPU 105 sends the configuration instruction to the FPGA 104 (step S305). Subsequently, the FPGA 104 sends the configuration instruction to the PLD 103 (step S306). Then, the PLD 103 provides a configuration command to the FPGA 104 (step S307). Further, the PLD 103 read-accesses the address value 0x010000 of the flash memory 101 (step S308). Then, the PLD 103 reads the startup side information (step S309). Then, the PLD 103 sets the first circuit information A as the configuration target in accordance with the read 0x0. Then, the PLD 103 read-accesses the address value 0x000000 in the flash memory 101 (step S310). That is, the PLD 103 inquires the start address value of the first circuit information A and reads the start address value 0x02 of the first circuit information A (step S311). Then, the PLD 103 read-accesses the address value 0x000001 (step S312). That is, the PLD 103 inquires the end address value of the first circuit information A and reads the end address value 0x40 of the first circuit information A (step S313). Then, the PLD 103 read-accesses the address value 0x020000 (step S314). Then, the PLD 103 reads first data of the first circuit information A (step S315). In this case, the PLD 103 shapes the read data of the first circuit information A for the Config I/F. Then, the PLD 103 transmits the first data of the first circuit information A to the FPGA 104 (step S316). In this case, since the first data passes the CRC check, the FPGA 104 writes the first data.

Then, the PLD 103 read-accesses the address value 0x020001 (step S317). Then, the PLD 103 reads the second data of the first circuit information A (step S318). In this case, the PLD 103 shapes the read data for the Config I/F. Then, the PLD 103 transmits the second data of the first circuit information A to the FPGA 104 (step S319). In this case, since the second data passes the CRC check, the FPGA 104 writes the second data.

Subsequently, the PLD 103 read-accesses the address value 0xXXXXXX (<0x410000) (step S320). Then, the PLD 103 reads data of the address value 0xXXXXXX (<0x410000). For example, the PLD 103 finally reads the last data of the first circuit information A (step S321). In this case, the PLD 103 shapes the read data of the first circuit information A for the Config I/F. Then, the PLD 103 transmits the read last data of the first circuit data A to the FPGA 104 (step S322). In this case, since the last data passes the CRC check, the FPGA 104 writes the last data. Subsequently, the FPGA 104 notifies the PLD 103 of the completion of the configuration (step S323). In this case, the PLD 103 confirms that the FPGA 104 has started up using the first circuit information A.

Then, the PLD 103 notifies the FPGA 104 of 0x0 as a level signal (step S324). In this case, the FPGA 104 recognizes that the FPGA 104 has started up using the first circuit information A from the notified 0x0. Further, the PLD 103 resets the configuration failure counter value (counter value 0). Then, the PLD 103 performs software reset on the FPGA 104 (step S325). In this case, the FPGA 104 starts up and stores 0x0 in the startup information register.

Then, the CPU 105 read-accesses the startup information register of the FPGA 104 (step S326). Then, the FPGA 104 reads 0x0 and transmits this data to the CPU 105 (step S327). As a result, the CPU 105 confirms that the FPGA 104 has started up using the first circuit information A that is expected.

Figure 13:
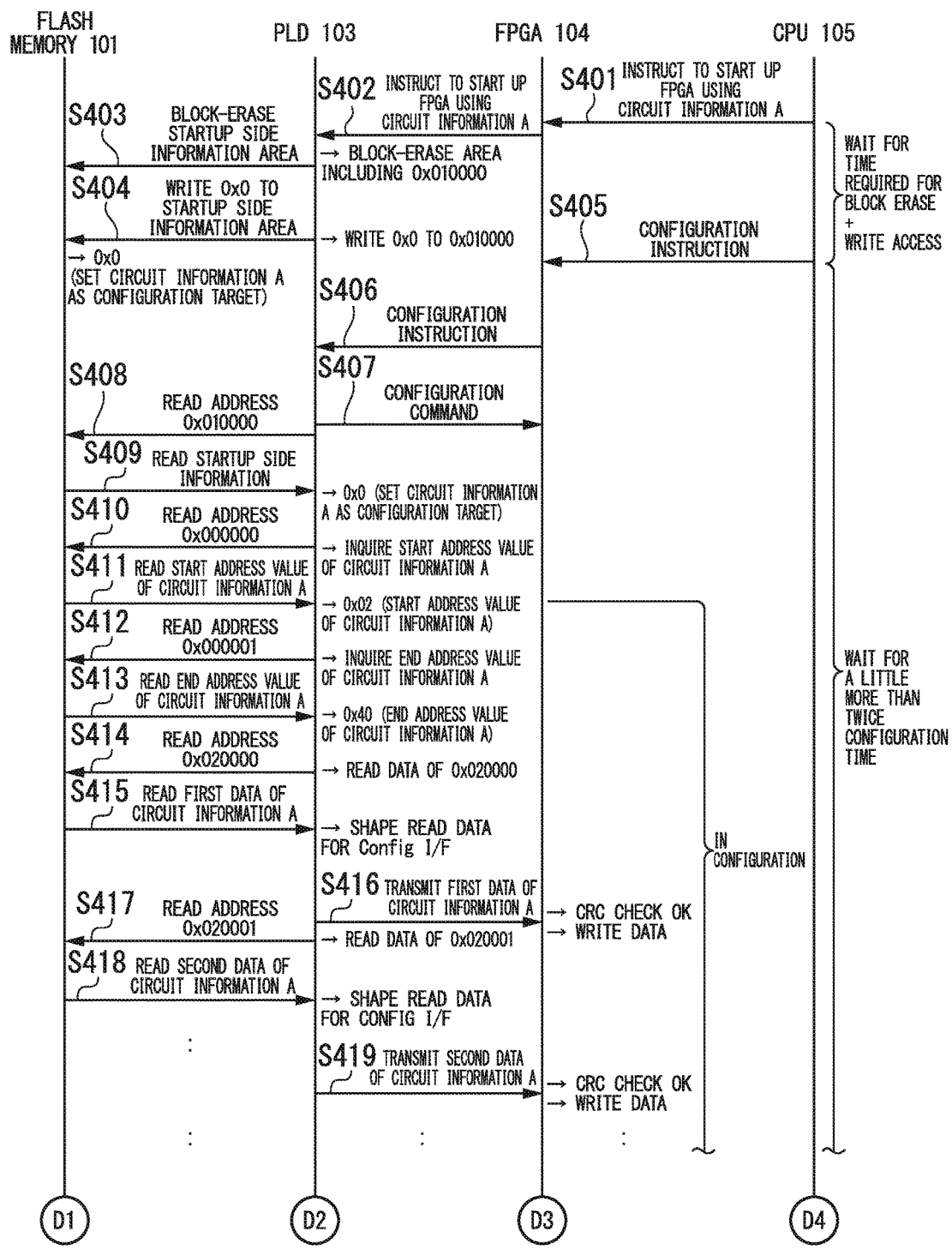
FIG. 13 is a diagram illustrating an example of a specific behavior of the configuration control system 100.
Figure 14:
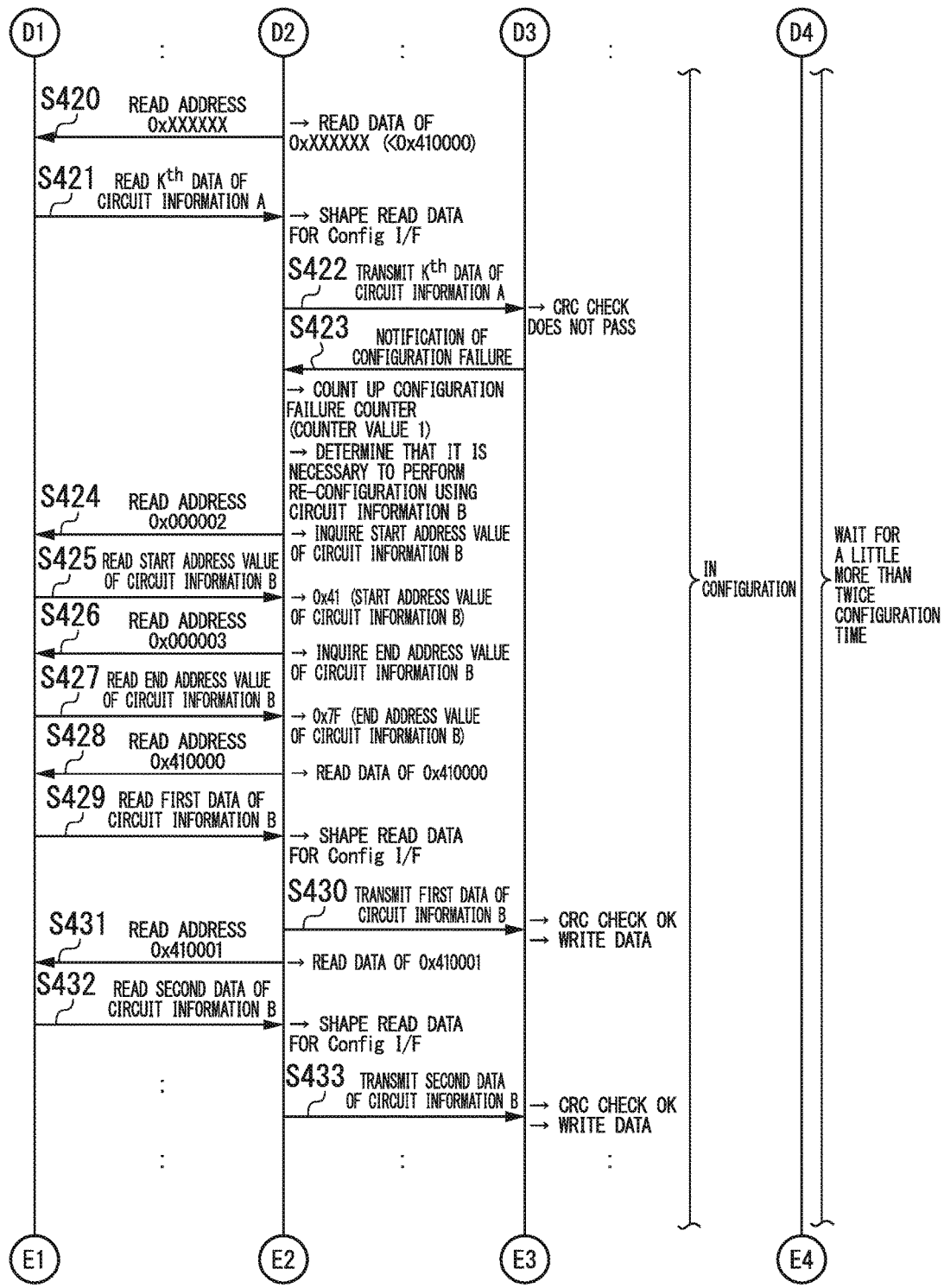
FIG. 14 is a diagram illustrating an example of a specific behavior of the configuration control system 100.
Figure 15:
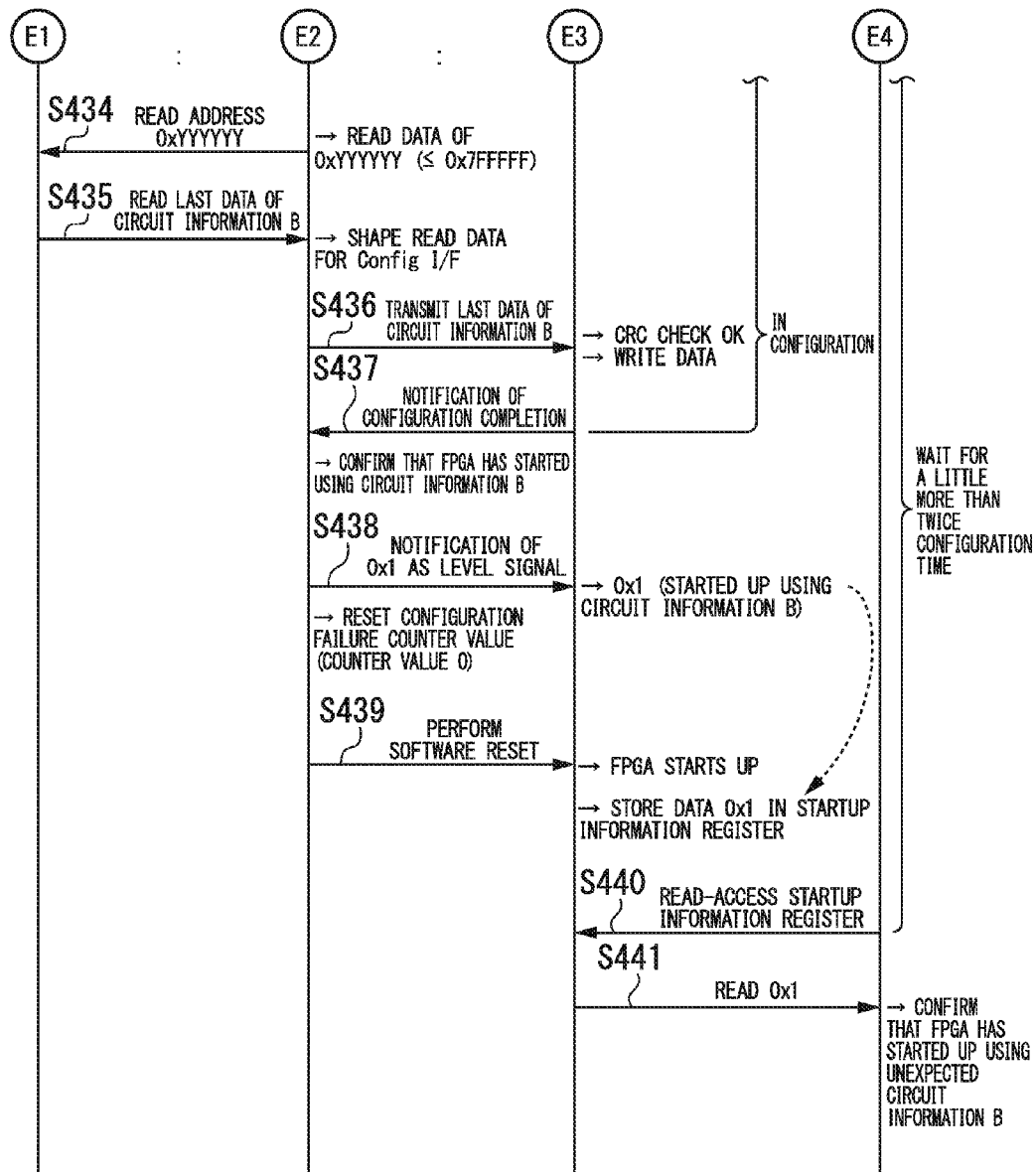
FIG. 15 is a diagram illustrating an example of a specific behavior of the configuration control system 100.

FIGS. 13 to 15 are diagrams illustrating an example of a specific behavior of the configuration control system 100 when a first configuration fails. It is to be noted that here, while the case in which the configuration control system 100 includes the single flash memory 101 will be described, a similar routine can be executed even when the configuration control system 100 includes the flash memory 101 and the flash memory 102. It is to be noted that since steps S401 to S420 are the same as steps S301 to S320, a description thereof is omitted. The PLD 103 reads K$^{th}$ data of the first circuit information A (step S421). In this case, the PLD 103 shapes the read data of the first circuit information A for the Config I/F. Then, the PLD 103 transmits the read K$^{th}$ data of the first circuit information A to the FPGA 104 (step S422). In this case, in the FPGA 104, CRC check does not pass. Subsequently, the FPGA 104 notifies the PLD 103 of the configuration failure (step S423). Accordingly, the PLD 103 counts up the configuration failure counter (counter value+ 1). The CPU 105 determines that it is necessary to perform the configuration using the second circuit information B.

Then, the PLD 103 read-accesses the address value 0x000002 of the flash memory 101 (step S424). In other words, the PLD 103 inquires the start address value of the second circuit information B, and reads the start address value 0x41 of the second circuit information B (step S425).

Then, the PLD 103 read-accesses the address value 0x000003 (step S426). That is, the PLD 103 inquires the end address value of the second circuit information B, and reads the end address value of the second circuit information B (step S427). As a result, the PLD 103 reads the end address value 0x7F of the second circuit information B. Then, the PLD 103 read-accesses the address value 0x410000 (step S428). Then, the PLD 103 reads first data of the second circuit information B (step S429). In this case, the PLD 103 shapes the read data of the second circuit information B for the Config I/F. Then, the PLD 103 transmits the first data of the second circuit information B to the FPGA 104 (step S430). In this case, since the first data passes the CRC check, the FPGA 104 writes the first data.

Then, the PLD 103 read-accesses the address value 0x410001 (step S431). Then, the PLD 103 reads the second data of the second circuit information B (step S432). In this case, the PLD 103 shapes the read data for the Config I/F. Then, the PLD 103 transmits the second data of the second circuit information B to the FPGA 104 (step S433). In this case, the FPGA 104 writes the second data since the second data passes the CRC check.

Then, the PLD 103 read-accesses the address value 0xYYYYYY (step S434). Then, the PLD 103 reads data of the address value 0xYYYYYY (≤0x7FFFFF). For example, the PLD 103 finally reads last data of the second circuit information B (step S435). In this case, the PLD 103 shapes the read data of the second circuit information B for the Config I/F. Then, the PLD 103 transmits the read last data of the second circuit information B to the FPGA 104 (step S436). In this case, since the last data passes the CRC check, the FPGA 104 writes the last data. Subsequently, the FPGA 104 notifies the PLD 103 of the completion of the configuration (step S437). In this case, the PLD 103 confirms that the FPGA 104 has started using the second circuit information B.

Then, the PLD 103 notifies the FPGA 104 of 0x1 as a level signal (step S438). As a result, the FPGA 104 recognizes that the FPGA 104 starts up using the second circuit information B from the notified 0x1. Further, the PLD 103 resets the configuration failure counter value (counter value 0). Then, the PLD 103 performs software reset on the FPGA 104 (step S439). As a result, the FPGA 104 starts up and stores 0x1 in the startup information register.

Subsequently, the CPU 105 read-accesses the startup information register of the FPGA 104 (step S440). Then, the FPGA 104 reads 0x1 and transmits 0x1 to the CPU 105 (step S441). As a result, the CPU 105 confirms that the FPGA 104 has started up using the second circuit information B that is not expected.

Figure 16:
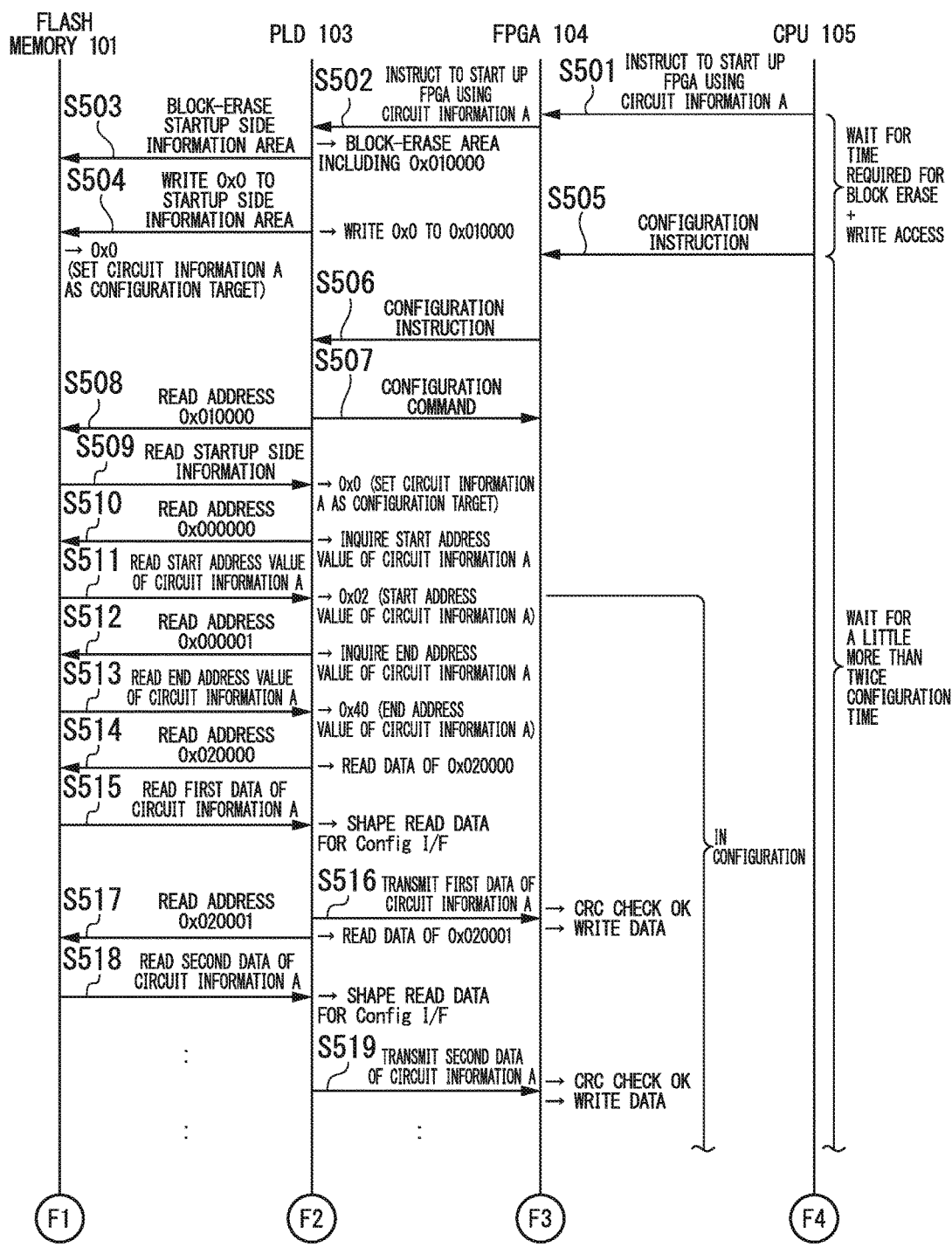
FIG. 16 is a diagram illustrating an example of a specific behavior of the configuration control system 100.
Figure 17:
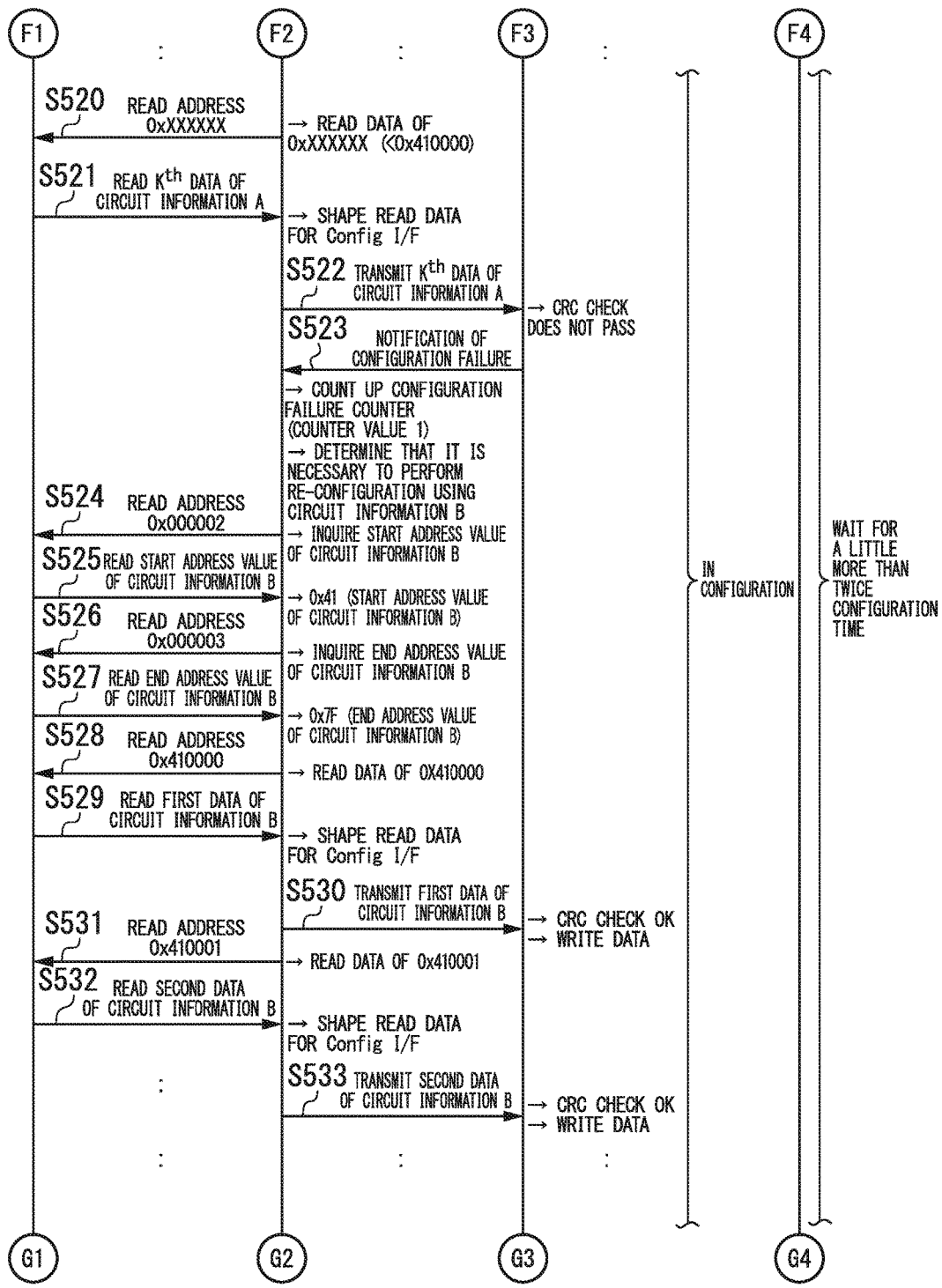
FIG. 17 is a diagram illustrating an example of a specific behavior of the configuration control system 100.
Figure 18:
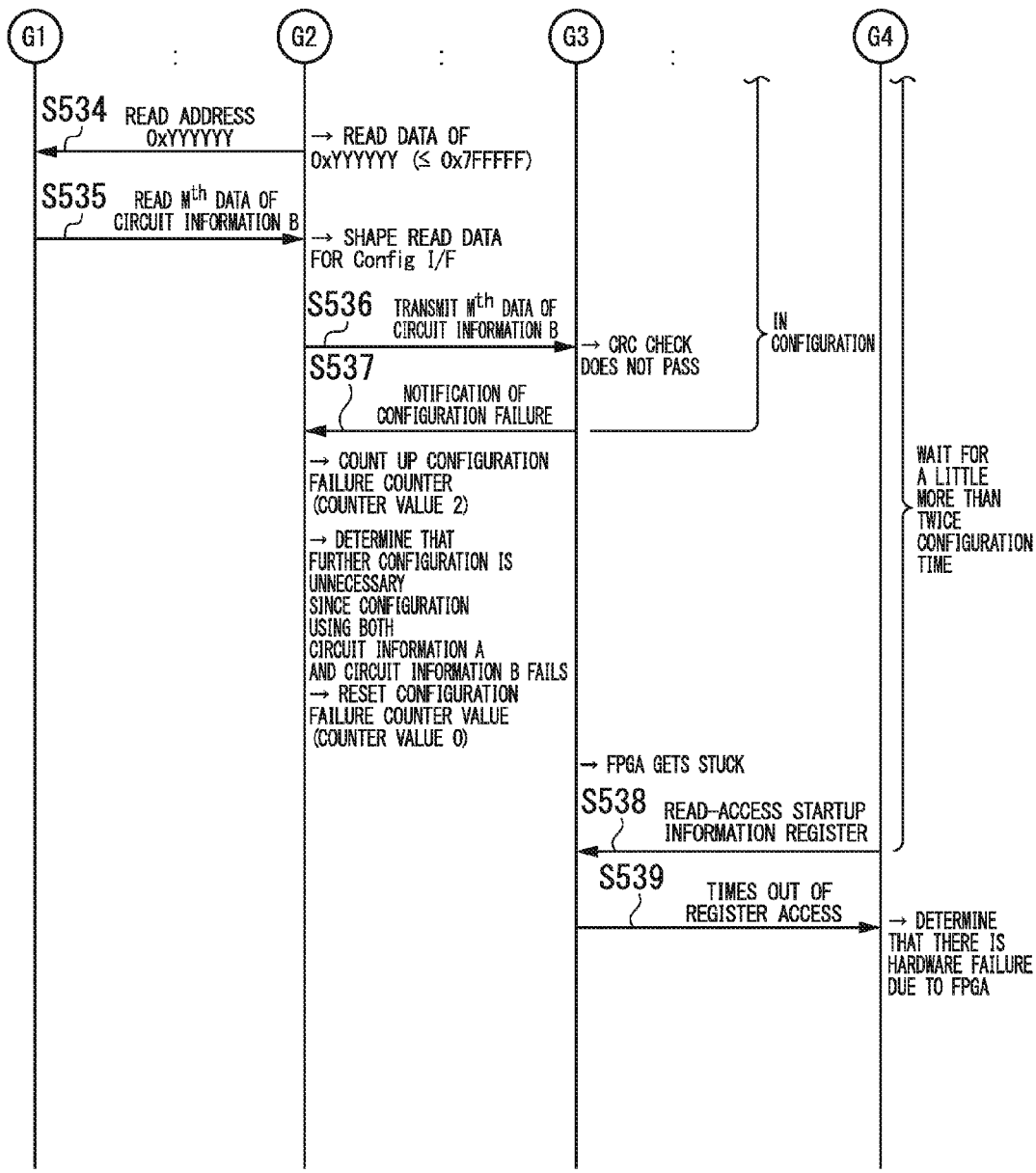
FIG. 18 is a diagram illustrating an example of a specific behavior of the configuration control system 100.

FIGS. 16 to 18 are diagrams illustrating an example of specific behavior of the configuration control system 100 when the second configuration also fails. It is to be noted that here, while the case in which the configuration control system 100 includes the single flash memory 101 will be described, a similar routine can be executed even when the configuration control system 100 includes the flash memory 101 and the flash memory 102. It is to be noted that since steps S501 to S533 are the same as steps S401 to S433, a description thereof is omitted. The PLD 103 transmits the second data of the second circuit information B to the FPGA 104 (step S533). In this case, since the second data passes the CRC check, the FPGA 104 writes the second data.

Then, the PLD 103 read-accesses the address value 0xYYYYYY (step S534). Then, the PLD 103 reads data of the address value 0xYYYYYY (≤0x7FFFFF). Then, the PLD 103 reads $M^{th}$ data of the second circuit information B (step S535). In this case, the PLD 103 shapes the read data of the second circuit information B for the Config I/F. Then, the PLD 103 transmits the read $M^{th}$ data of the second circuit information B to the FPGA 104 (step S536). In this case, in the FPGA 104, CRC check of the $M^{th}$ data does not pass. Subsequently, the FPGA 104 notifies the PLD 103 of failure of the configuration (step S537). In this case, the PLD 103 counts up the configuration failure counter (counter value+1=2). Further, since the configuration fails using both the first circuit information A and the second circuit information B, the CPU 105 determines that further configuration is unnecessary. Then, the PLD 103 resets the configuration failure counter value (counter value 0).

Then, the FPGA 104 gets stuck. Then, the CPU 105 read-accesses the startup information register of the FPGA 104 (step S538). However, a time-out of the register access to the FPGA 104 occurs (step S539). Accordingly, the CPU 105 determines that there is hardware failure caused by the FPGA 104.

As described above, since the configuration control system 100 stores the same circuit information as the circuit information A and the circuit information B in the flash memory 101 and the flash memory 102, normal startup can be performed using the other piece of data B (A) even when the soft error occurs in one piece of data A (B). Therefore, the configuration control system 100 can operate with the same functions as before the soft error occurs without system failure, and can be effectively applied to, particularly, a system in which a power-on sequence is frequently generated.

Further, when the same data is stored as the circuit information A and the circuit information B, and the data is to be upgraded during operation using the first circuit information A, the configuration control system 100 overwrites the upgraded data to only the area of the second circuit information B of the flash memory 101 and the flash memory 102, and then performs the configuration using the overwritten data. In this case, if the soft error occurs in the overwritten data and the configuration fails, the data is restored to a previous version and the system can be started up by performing the re-configuration using the existing first circuit information A. Therefore, the configuration control system 100 can perform a configuration request using the data overwritten from the CPU 105 again without system failure. Thus, the configuration control system 100 is also effective when the circuit information is to be upgraded, for example, due to correction of a bug in a design and/or addition of a function to the design of the FPGA 104.

As described above, in the configuration control system 100, when the configuration using the first circuit information A fails, the PLD 103 performs the configuration using the second circuit information B again. Therefore, the configuration control system 100 can start up the FPGA 104 without system failure when the soft error occurs.

Further, in the configuration control system 100, since the PLD 103 includes the single signal line 107 for notifying about which of the circuit information A and the circuit information B stored in the flash memory 101 and the flash memory 102 is used to perform the configuration, a circuit configuration is not complicated and can be simplified.

Also, in the configuration control system 100, the startup side information area E of the flash memory 101 can store the startup side information, and the start/end address information area F of the flash memory 101 and the flash memory 102 can store the start/end address information.

Further, in the configuration control system 100, since the PLD 103 includes a retry sequencer for performing a re-configuration when the configuration fails, it is possible to improve accuracy of the configuration.

Further, in the configuration control system 100, since the circuit information A and the circuit information B are stored in the flash memory 101 and the flash memory 102 as the same circuit information, normal startup can be performed using the other piece of data B (A) even when the soft error occurs in one piece of data A (B). Therefore, the configuration control system 100 can operate with the same functions as before the soft error occurs without system failure, and is effective in, particularly, a system in which a power-on sequence is frequently generated.

In the configuration control method, when the soft error occurs, the PLD 103 can start up the FPGA 104 without system failure.

It is to be noted that the configuration control system and the configuration control method are not limited to the above-described exemplary embodiments, and appropriate modifications, improvements, or the like can be made.

Priority is claimed on Japanese Patent Application No. 2013-123473, filed on Jun. 12, 2013, the content of which is incorporated herein by reference.

INDUSTRIAL APPLICABILITY

The present invention, for example, can be applied to a system including a semiconductor chip, such as an FPGA. In accordance with the present invention, it is possible to start up the FPGA without system failure even when a soft error occurs.

DESCRIPTION OF REFERENCE SIGNS

100 Configuration control system
101 Flash memory
102 Flash memory
103 PLD
104 FPGA
105 CPU
106 Personal computer
107 Signal line
108 Cable
109 Cable
110 JTAG interface
111 Cable
112 Cable
113 Cable
A First circuit information
B Second circuit information
C First storage area
D Second storage area
E Startup side information area
F Start/end address information area

The invention claimed is:

1. A configuration control system, comprising:
   a first semiconductor chip which is capable of programming a logic circuit inside a large scale integrated circuit (LSI);
   a semiconductor memory which stores a plurality of pieces of circuit information of the first semiconductor chip; and
   a second semiconductor chip which, when controlling a configuration of the first semiconductor chip using the circuit information stored in the semiconductor memory, if the configuration using any one of the plurality of pieces of circuit information fails, performs a re-configuration using another piece of circuit information among the plurality of pieces of circuit information,
   wherein the second semiconductor chip includes a signal line for notifying the first semiconductor chip about which piece of the plurality of pieces of the circuit information stored in the semiconductor memory is used to perform the configuration or the re-configuration.

2. The configuration control system according to claim 1, wherein the semiconductor memory further stores startup side information indicating the circuit information used for the configuration and address information indicating a start position and an end position of each piece of the circuit information.

3. A configuration control system, comprising:
   a first semiconductor chip which is capable of programming a logic circuit inside a large scale integrated circuit (LSI);
   a semiconductor memory configured to store first and second circuit information; and
   a second semiconductor chip configured to perform configuration of the first semiconductor chip using the first circuit information and, if the configuration using the first circuit information fails, to perform a re-configuration of the first semiconductor chip using the second circuit information,
   wherein the second semiconductor chip is configured to notify which of the first or the second circuit information is used to perform the configuration or the re-configuration.

4. A configuration control method for a first semiconductor chip that is capable of programming a logic circuit inside a large scale integrated circuit (LSI) using first or second circuit information, the method comprising:
   configuring, by a second semiconductor chip, the first semiconductor chip using the first circuit information,
   determining that the configuring of the first semiconductor chip using the first circuit information has failed;
   re-configuring, by the second semiconductor chip, the first semiconductor chip using the second circuit information, and
   notifying, by the second semiconductor chip, that the second circuit information is used to perform the re-configuring.

* * * * *